(12) United States Patent
Akiba et al.

(10) Patent No.: US 11,158,617 B2
(45) Date of Patent: Oct. 26, 2021

(54) SEMICONDUCTOR DEVICE INCLUDING A CIRCUIT FOR TRANSMITTING A SIGNAL

(71) Applicant: RENESAS ELECTRONICS CORPORATION, Tokyo (JP)

(72) Inventors: Toshihiko Akiba, Tokyo (JP); Kenji Sakata, Tokyo (JP); Nobuhiro Kinoshita, Tokyo (JP); Yosuke Katsura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 115 days.

(21) Appl. No.: 16/444,933

(22) Filed: Jun. 18, 2019

(65) Prior Publication Data

US 2020/0006303 A1    Jan. 2, 2020

(30) Foreign Application Priority Data

Jun. 27, 2018  (JP) .............................. JP2018-122161

(51) Int. Cl.
*H01L 23/02* (2006.01)
*H01L 25/16* (2006.01)
(Continued)

(52) U.S. Cl.
CPC ........ *H01L 25/165* (2013.01); *H01L 23/3675* (2013.01); *H01L 23/49816* (2013.01); *H01L 23/49822* (2013.01); *H01L 23/49838* (2013.01); *H01L 24/32* (2013.01); *H01L 24/05* (2013.01); *H01L 24/16* (2013.01); *H01L 24/27* (2013.01); *H01L 24/33* (2013.01); *H01L 24/73* (2013.01); *H01L 24/83* (2013.01); *H01L 25/105* (2013.01); *H01L 2224/0401* (2013.01); *H01L 2224/05083* (2013.01); *H01L 2224/05084* (2013.01); *H01L 2224/05144* (2013.01); *H01L 2224/05147* (2013.01); *H01L 2224/05155* (2013.01); *H01L 2224/05166* (2013.01); *H01L 2224/13147* (2013.01); *H01L 2224/13155* (2013.01);
(Continued)

(58) Field of Classification Search
CPC ........... H01L 23/3675; H01L 23/49816; H01L 23/49822; H01L 23/49838; H01L 24/32
USPC .......................................... 257/680, 516, 535
See application file for complete search history.

(56) References Cited

U.S. PATENT DOCUMENTS 6,239,486 B1   5/2001  Shimizu et al.
10,056,323 B2  8/2018  Nakagawa et al.
(Continued)

FOREIGN PATENT DOCUMENTS

JP   2000-311960 A   11/2000
WO  2015/162768 A1   10/2015

*Primary Examiner* — Jami Valentine Miller
*Assistant Examiner* — Dilinh P Nguyen
(74) *Attorney, Agent, or Firm* — McDermott Will & Emery LLP

(57) ABSTRACT

Reliability of a semiconductor device is improved. The semiconductor device PKG1 includes a wiring substrate SUB1, a semiconductor chip CHP1 and a capacitor CDC mounted on the upper surface $2t$ of the wiring substrate SUB1, and a lid LD formed of a metallic plate covering the semiconductor chip CHP1 and the wiring substrate SUB1. The semiconductor chip CHP1 is bonded to the lid LD via a conductive adhesive layer, and the capacitor CDC, which is thicker than the thickness of the semiconductor chip CHP1, is disposed in the cut off portion $4d1$ provided in the lid LD, and is exposed from the lid LD.

15 Claims, 16 Drawing Sheets

(51) Int. Cl.
*H01L 23/367* (2006.01)
*H01L 23/00* (2006.01)
*H01L 23/498* (2006.01)
*H01L 25/10* (2006.01)

(52) U.S. Cl.
CPC ............... *H01L 2224/16227* (2013.01); *H01L 2224/32225* (2013.01); *H01L 2224/33181* (2013.01); *H01L 2224/73204* (2013.01); *H01L 2224/73253* (2013.01); *H01L 2924/19041* (2013.01); *H01L 2924/19105* (2013.01)

(56) References Cited

U.S. PATENT DOCUMENTS

| | | | |
|---|---|---|---|
| 2004/0166763 A1* | 8/2004 | Hanada | H01L 24/97 445/51 |
| 2017/0033038 A1* | 2/2017 | Nakagawa | H01L 23/49816 |
| 2018/0158772 A1* | 6/2018 | Tanaka | H01L 23/642 |

* cited by examiner

SEMICONDUCTOR DEVICE INCLUDING A CIRCUIT FOR TRANSMITTING A SIGNAL

CROSS-REFERENCE TO RELATED APPLICATIONS

The disclosure of Japanese Patent Application No. 2018-122161 filed on Jun. 27, 2018 including the specification, drawings and abstract is incorporated herein by reference in its entirety.

TECHNICAL FIELD OF THE INVENTION

The present invention relates to a semiconductor device, and, for example, to a technology effective for application to a semiconductor device including a circuit for transmitting a signal at high speed.

BACKGROUND OF THE INVENTION

In Japanese Patent Application publication No. 2000-311960, there is disclosed a semiconductor device having a structure in which a semiconductor chip and a capacitor mounted on a wiring substrate are covered with a cap, and a heat sink having fins is attached to a top wall of the cap.

In FIG. 6 of WO Patent Application Publication No. 2015-162768, there is disclosed a semiconductor device having a structure in which a semiconductor chip, a capacitor for a power supply circuit, and a capacitor for a DC circuit are mounted on a wiring substrate is described.

The semiconductor chip and the capacitor for the power supply circuit are covered with the heat radiating plate, and the capacitor for the DC circuit is not covered with the heat radiating plate but is disposed in a region outside the heat radiating plate.

The semiconductor device examined by the inventor of the present application has a wiring substrate, a semiconductor chip and a plurality of capacitors mounted on the wiring substrate, and a lid covering the semiconductor chip and the plurality of capacitors, which corresponds to the cap or the heat sink described above.

The semiconductor chip is flip-chip connected to the wiring substrate.

That is, the surface of the semiconductor chip is disposed facing the wiring substrate, and is connected to the pads (terminals) of the wiring substrate via the protruding electrodes.

A lid is attached to the back surface of the semiconductor chip via an adhesive layer.

The plurality of capacitors are arranged in a space between the wiring board and the lid, and the two terminals of the capacitor are respectively connected to the two electrodes of the wiring board, but a gap is provided between the metal lid and the capacitor so that the two terminals of the capacitor are not short-circuited.

Therefore, the thickness of the semiconductor chip is equal to or larger than the thickness of the capacitor.

The semiconductor chip investigated by the inventor of the present application uses a low-k film having low mechanical strength as an interlayer insulating film for separating a plurality of wiring layers provided on a semiconductor substrate.

Here, the Low-k film is defined as an insulating film having a relative dielectric constant of 3.7 or less.

When a semiconductor chip using a Low-k film is flip-chip connected, a problem has been confirmed that thermal stress is applied to the protruding electrodes due to a difference in thermal expansion coefficient between a semiconductor substrate made of silicon and a wiring substrate, and cracks occur in an interlayer insulating film (Low-k film) having low mechanical strength.

In order to prevent the occurrence of such cracks, the inventors of the present application have investigated thinning the thickness of the semiconductor chip.

However, the inventors of the present application have confirmed that, when the semiconductor chip is thinned, the gap described above is eliminated, the two terminals of the capacitor are short-circuited by the metal lid, the functional characteristic of the semiconductor device is defective, and the reliability is lowered.

That is, in a semiconductor device in which a semiconductor chip and a capacitor are mounted on a wiring substrate, a technique for improving reliability is required.

Other objects and novel features will become apparent from the description of this specification and the accompanying drawings.

A semiconductor device according to an embodiment includes: a wiring substrate including a first main surface including a first side extending in a first direction; a second main surface opposite to the first main surface; and a first external electrode disposed on a second main surface; a semiconductor chip including a first front surface, a first back surface opposite to the first front surface, and a first electrode disposed on the first front surface, and mounted on the wiring substrate such that the first front surface faces the first main surface; a first capacitor mounted on the first main surface in a region different from the region in which the semiconductor chip is mounted, and including a first terminal and a second terminal; and a lid bonded to the first back surface of the semiconductor chip via a first adhesive layer and covering the first main surface of the wiring substrate.

The first electrode of the semiconductor chip is connected to the first terminal of the first capacitor, the second terminal of the first capacitor is connected to the first external terminal of the wiring board, the thickness of the semiconductor chip is thinner than the thickness of the first capacitor and includes a second side extending in the first direction of the lid, the second side extending along the first side of the wiring board, and the first capacitor is disposed in the first notched portion provided on the second side of the lid and exposed from the lid.

According to the above embodiment, the reliability of the semiconductor device can be improved.

BRIEF DESCRIPTIONS OF THE DRAWINGS

DESCRIPTIONS OF THE PREFERRED EMBODIMENTS

Figure 1:
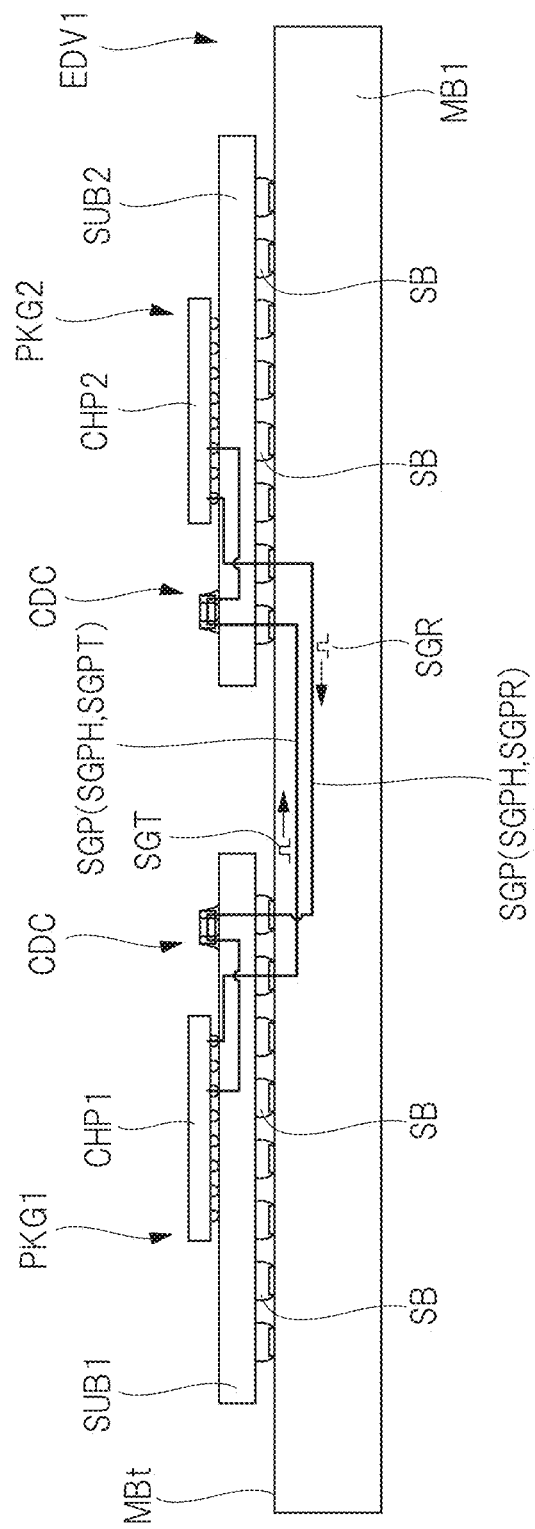
FIG. 1 is an explanatory diagram showing a configuration example of an electronic device.

In the present application, descriptions of embodiments will be divided into a plurality of sections or the like for convenience of description, if necessary, except where expressly stated otherwise, these are not independent from each other, and each part of a single example, one of which is a partial detail or a part or all of the other, whether before or after the description.

In principle, descriptions of similar parts are omitted. Also, each component in an embodiment is not essential, unless expressly stated otherwise, theoretically limited to that number, and obviously otherwise from the context.

Similarly, in the description of the embodiment and the like, "X consisting of A" or the like with respect to the material, composition, and the like does not exclude elements other than A, except when it is clearly indicated that this is not the case and when it is obvious from the context that this is not the case.

For example, regarding a component, it means "X including A as a main component" or the like.

For example, a "silicon member" or the like is not limited to pure silicon, and it is needless to say that a member including a SiGe (silicon-germanium) alloy, a multi-element alloy containing silicon as its main component, other additives, or the like is also included.

In addition, the gold plating, Cu layer, nickel plating, and the like include not only pure materials, but also members containing gold, Cu, nickel, and the like as main components, respectively, unless otherwise specified.

In addition, reference to a specific numerical value or quantity may be greater than or less than that specific numerical value, unless expressly stated otherwise, theoretically limited to that number, and obviously not so from the context.

In the drawings of the embodiments, the same or similar parts are denoted by the same or similar symbols or reference numerals, and the description will not be repeated in principle.

In addition, in the attached drawings, hatching and the like may be omitted even in a cross-section when it becomes complicated or when it is clearly distinguished from a gap.

In this connection, even if the hole is closed in plan, the outline of the background may be omitted when it is obvious from the description or the like.

In addition, hatching or dot patterns may be added to indicate that it is not a void, even if it is not a cross-section, or to indicate the boundary of a region.

First, a configuration example of an electronic device in which a plurality of semiconductor devices (semiconductor packages) are mounted on a motherboard and electric signals are transmitted between the plurality of semiconductor devices will be described with reference to FIGS. 1 and 2.

FIG. 1 is an explanatory diagram showing a configuration example of an electronic device including the semiconductor device of the present embodiment.

Figure 2:
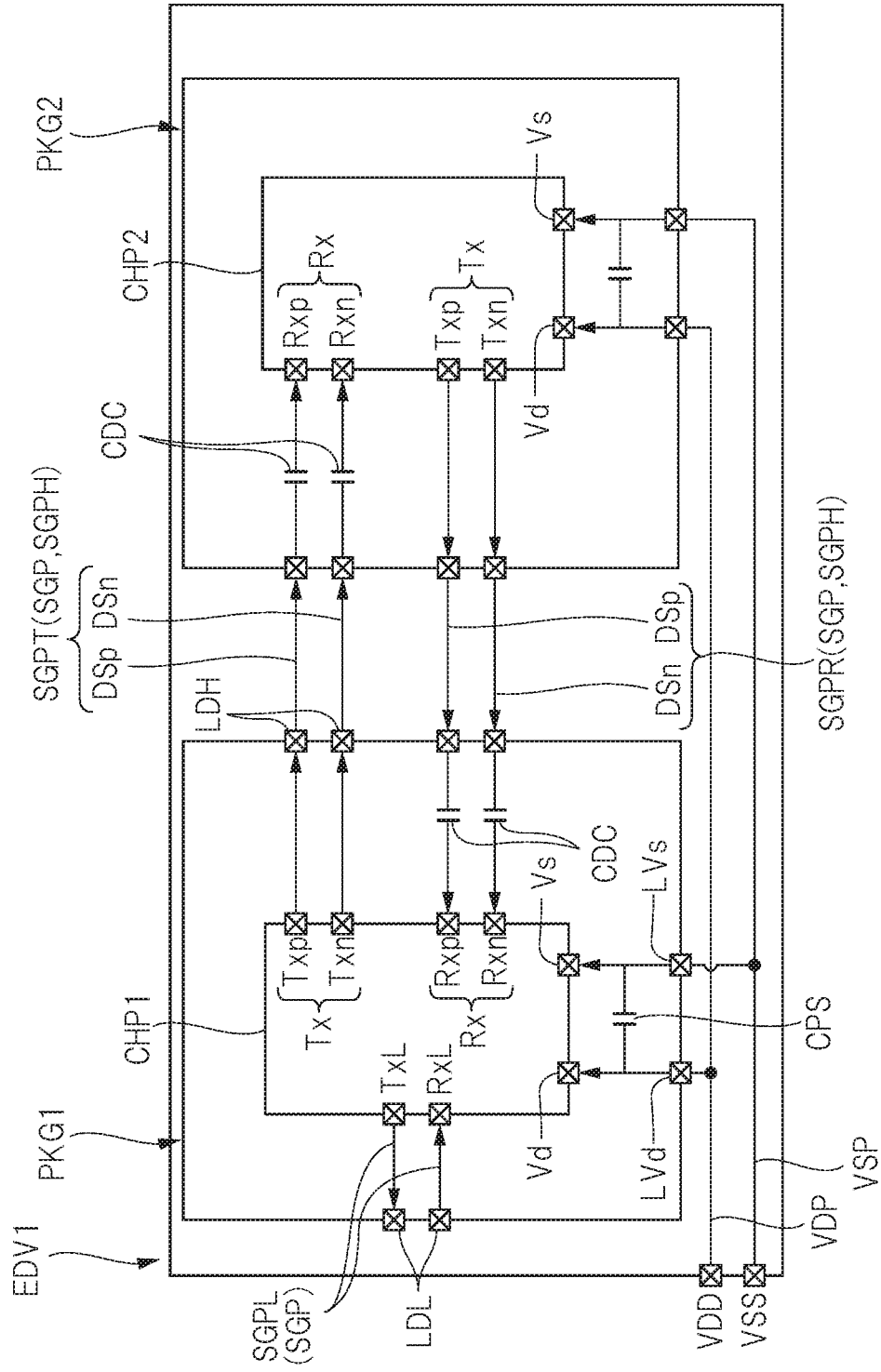
FIG. 2 is an explanatory diagram showing a configuration example of a circuit included in the electronic device shown in FIG. 1.

FIG. 2 is an explanatory diagram showing a configuration example of a circuit included in the electronic device shown in FIG. 1.

In FIG. 1, in order to explicitly indicate that the semiconductor device PKG1 and the semiconductor device PKG2 are electrically connected, the high-speed transmission path SGPH shown in FIG. 2 is schematically shown by a thick line.

The electronic device (electronic device) EDV1 shown in FIG. 1 includes a wiring board (motherboard, mounting board) MB1, and a semiconductor device PKG1 and a semiconductor device PKG2 mounted on the wiring board MB1.

The semiconductor device PKG1 and the semiconductor device PKG2 are electrically connected to each other via a signal transmission path SGP formed in the wiring board MB1.

The signal transmitted through the signal transmission path SGP includes a signal SGT outputted from the semiconductor device PKG1 and a signal SGR inputted to the semiconductor device PKG1.

The signal transmission path SGP includes a signal transmission path SGPT through which the signal SGT is transmitted and a signal transmission path SGPR through which the signal SGR is transmitted.

In the embodiment shown in FIG. 1, the signal SGT is outputted from the semiconductor device PKG1, and the signal SGT is inputted to the semiconductor device PKG2.

The signal SGR is outputted from the semiconductor device PKG2, and the signal SGR is inputted to the semiconductor device PKG1.

However, the output destination of the signal SGT and the output source of the signal SGR are not limited to the example shown in FIG. 1, and there are various modified examples.

Since the semiconductor device PKG1 and the semiconductor device PKG2 shown in FIG. 1 have the same structures, the semiconductor device PKG1 will be representatively described below.

As shown in FIG. 2, the electronic device EDV1 has a plurality of signaling paths SGPs.

In the examples shown in FIG. 2, the plurality of signal transmission paths SGPs connected to the semiconductor device PKG1 include a low-speed transmission path (low-speed signal transmission path) SGPL through which an electric signal is transmitted at a first transmission rate, and a high-speed transmission path (high-speed signal transmission path) SGPH through which an electric signal is transmitted at a second transmission rate higher than the first transmission rate.

In the embodiment shown in FIG. 2, the high-speed transmission path SGPH includes a pair of differential signal transmission paths DSp and DSn through which differential signals are transmitted.

In the present embodiment, an embodiment in which a differential signal is transmitted through a pair of differential signal transmission paths DSp and DSn is described as an example of the high-speed transmission path SGPH, but various modifications other than the differential signal can be applied to the type of the high-speed signal.

For example, even in the case of a so-called single-ended structure in which one signal transmission path SGP is used, high-speed transmission can be performed by increasing the frequency.

As shown in FIG. 2, the semiconductor chip CHP1 of the semiconductor device PKG1 includes a plurality of electrodes.

The plurality of electrodes of the semiconductor chip CHP1 include signal electrodes Tx (specifically, signal electrodes Txp and Txn for outputting a pair of differential signals) through which a signal SGT (see FIG. 1) as an output signal (transmission signal) is transmitted.

The plurality of electrodes of the semiconductor chip CHP1 include signal electrodes Rx (specifically, signal electrodes Rxp and Rzn to which a pair of differential signals are input) to which a signal SGR (see FIG. 1) as an input signal (reception signal) is transmitted.

In addition, in the embodiment shown in FIG. 2, the plurality of electrodes of the semiconductor chip CHP1 includes a signal electrode (low-speed signal electrode) TxL and a signal electrode (low-speed signal electrode) RxL, which are connected to the low-speed transmission path SGPL.

The plurality of electrodes of the semiconductor chip CHP1 include a power supply potential electrode Vd to which the power supply potential VDD is supplied and a reference potential electrode Vs to which the reference potential VSS is supplied.

The power supply potential VDD is supplied to the semiconductor chip CHP1 (i.e., circuits included in the semiconductor chip CHP1) via the power supply potential electrodes Vd.

The reference potential VSS is supplied to the semiconductor chip CHP1 via the reference potential electrodes Vs.

At least a part of the plurality of circuits included in the semiconductor chip CHP1 is driven by a driving voltage generated by a potential difference between the power supply potential VDD and the reference potential VSS.

The reference potential VSS is, for example, a ground potential, and the power supply potential VDD is higher than the reference potential VSS.

The electronic device EDV1 has a capacitor CPS for a power supply circuit that is inserted into the power supply circuit in parallel.

The capacitor CPS shown in FIG. 2 is inserted between a reference potential supply path VSP for supplying the reference potential VSS to the semiconductor chip CHP1 and a power supply potential supply path VDP for supplying the power supply potential VDD to the semiconductor chip CHP1.

The capacitor CPS can function as a bypass capacitor that bypasses and flows noise (signal) included in the power supply potential supply path VDP to the reference potential supply path VSP side.

In addition, the capacitor CPS can function as a decoupling capacitor that reduces the effect of the impedance components included in the power supply potential supply path VDP and the reference potential supply path VSP by reducing the loop (path length) of the current flowing through the circuits formed on the CHP1 of the semiconductor chip, thereby reducing the influence of the impedance components included in the power supply potential supply path VDP and the reference potential supply path VSP.

In addition, by connecting the capacitor CPS to the vicinity of the circuit which consumes the supplied power, it is possible to function as a battery which suppresses a phenomenon that the driving voltage drops instantaneously.

The bypass capacitor, the decoupling capacitor, or the capacitor CPS for the power supply circuit used as the battery are all inserted in the power supply circuit in parallel connection.

On the other hand, the capacitor CDC is inserted in the signal transmission path SGP in series connection.

Therefore, as shown in FIG. 2, when the high-speed transmission path SGPH is configured by the differential signal transmission paths DSp and DSn, the capacitors CDC are inserted into the differential signal transmission path DSp and the differential signal transmission path DSn, respectively.

When signals are transmitted at high speed as in the electronic device EDV1, it is preferable to connect the capacitor CDCs in series during the high-speed transmission path SGPH.

The DC components included in the AC signals can be cut off by the capacitor CDC inserted in the high-speed transmission path SGPH.

This makes it possible to stabilize the input and output of signals at high speed.

The capacitor CDC, which is inserted in the signal transmission path in series and cuts the DC components in the AC signal, is called a DC (Direct Current) cutting capacitor or an AC (Alternate Current) coupling capacitor (hereinafter referred to as a DC cutting capacitor).

In the low-speed transmission path SGPL shown in FIG. 2, electric signals are transmitted at a transmission rate of, for example, less than 3 Gbps (Gigabit per second).

In the high-speed transmission path SGPH formed by electrically connecting the signal electrode Tx and the signal electrode Rx, an electric signal is transmitted at a transmission rate of, for example, about 10 Gbps to 60 Gbps.

Figure 3:
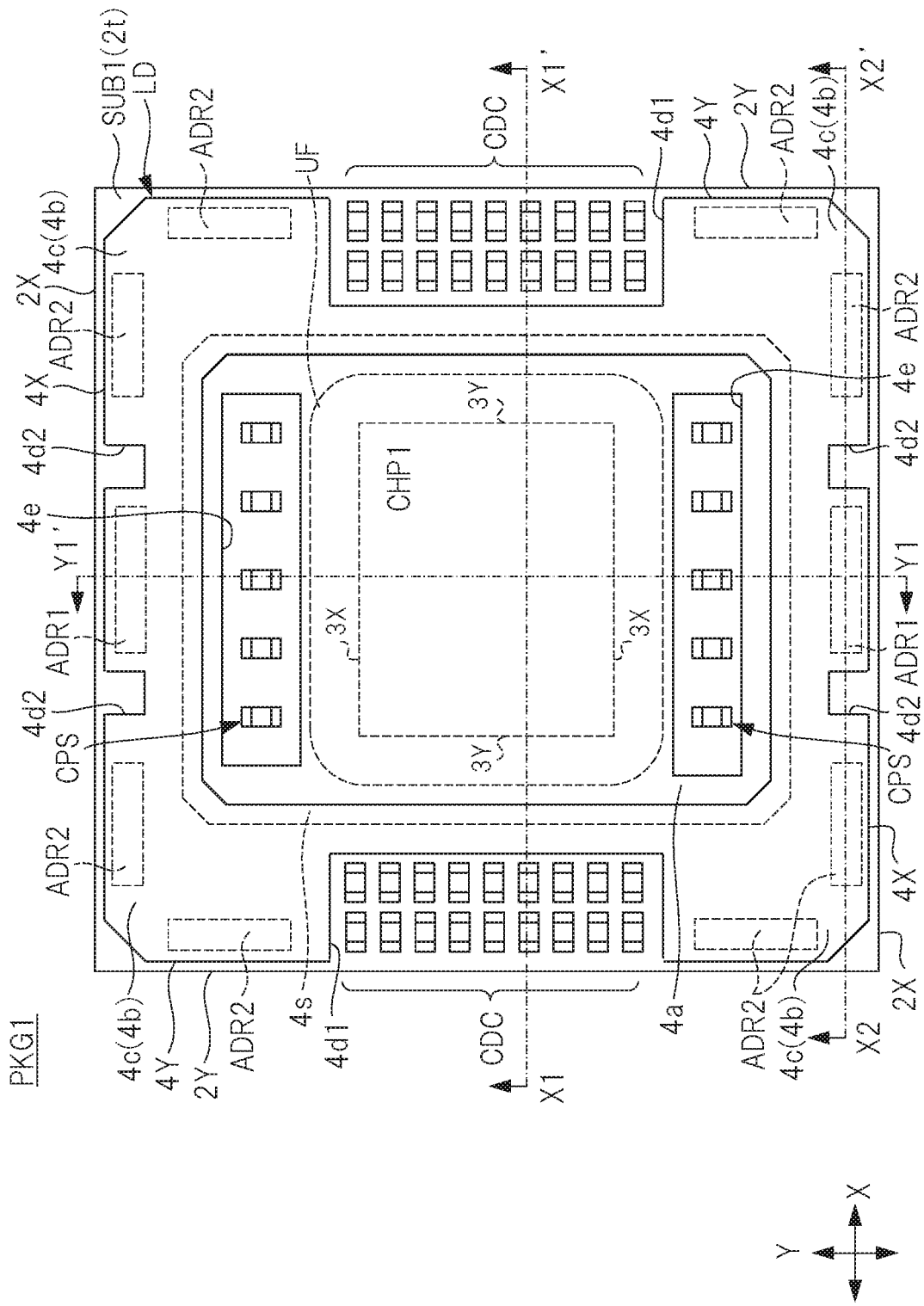
FIG. 3 is a top view of one of the two semiconductor devices shown in FIG. 1.
Figure 4:
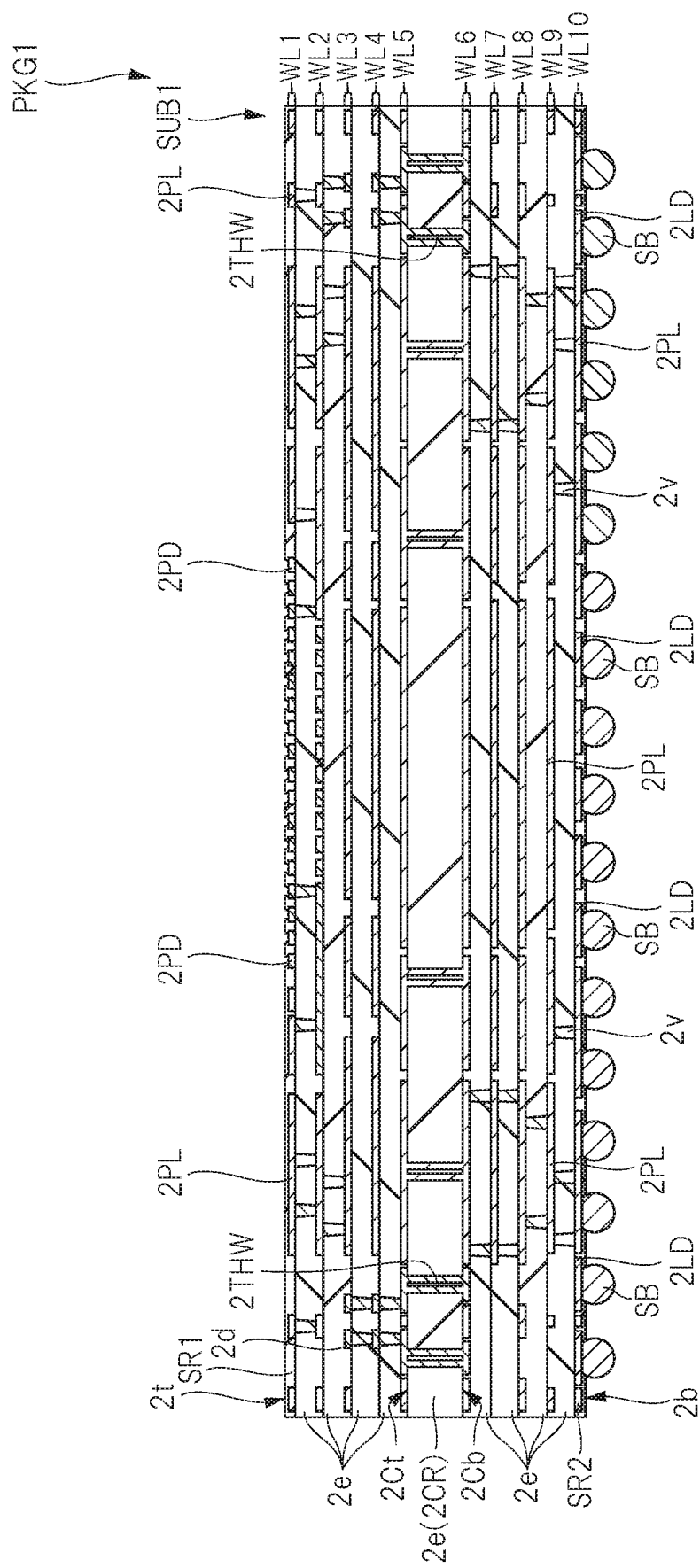
FIG. 4 is cross-sectional view of a wiring substrate constituting the semiconductor device shown in FIG. 3.
Figure 5:
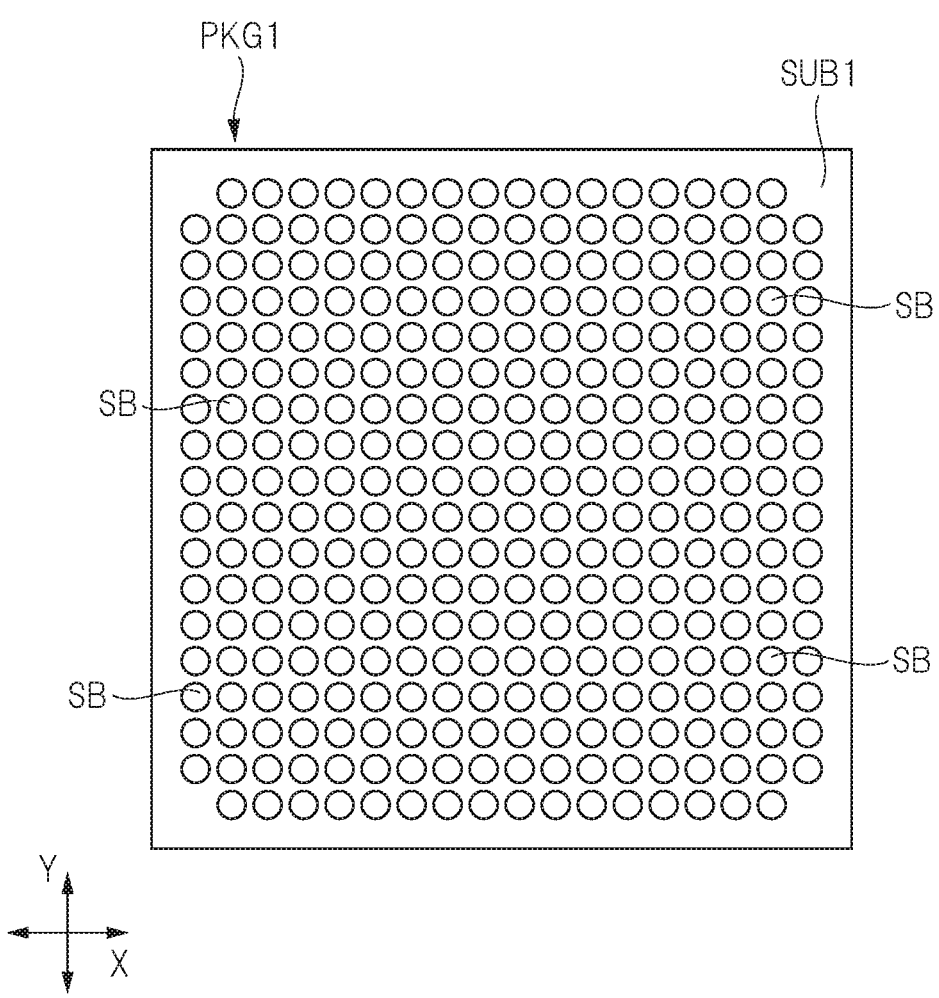
FIG. 5 is a bottom view of the semiconductor device shown in FIG. 3.
Figure 6:
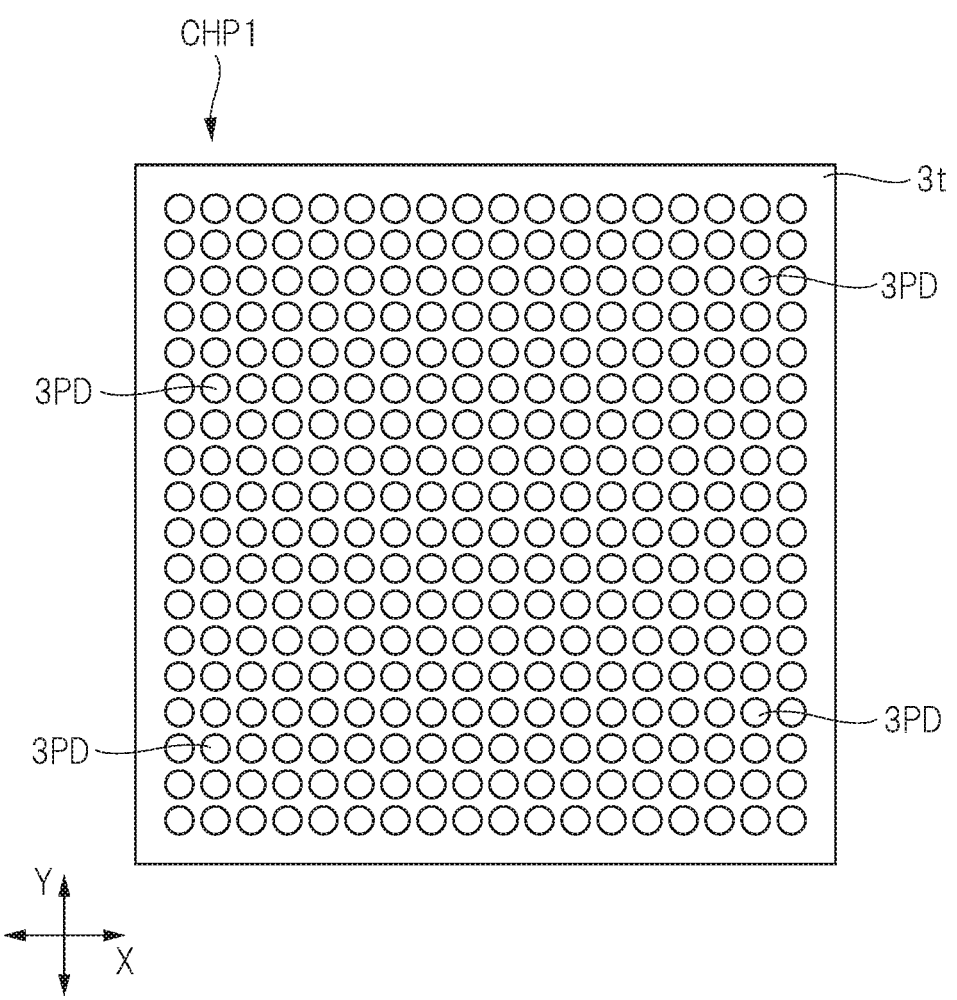
FIG. 6 is plan view of an electrode arrangement surface of the semiconductor chip shown in FIG. 3.

FIG. 3 is a top view of one of the two semiconductor devices shown in FIG. 1, FIG. 4 is cross-sectional view of a wiring substrate constituting the semiconductor device shown in FIG. 3, FIG. 5 is a bottom view of the semiconductor device shown in FIG. 3, and FIG. 6 is plan view of an electrode arrangement surface of the semiconductor chip shown in FIG. 3.

Figure 7:
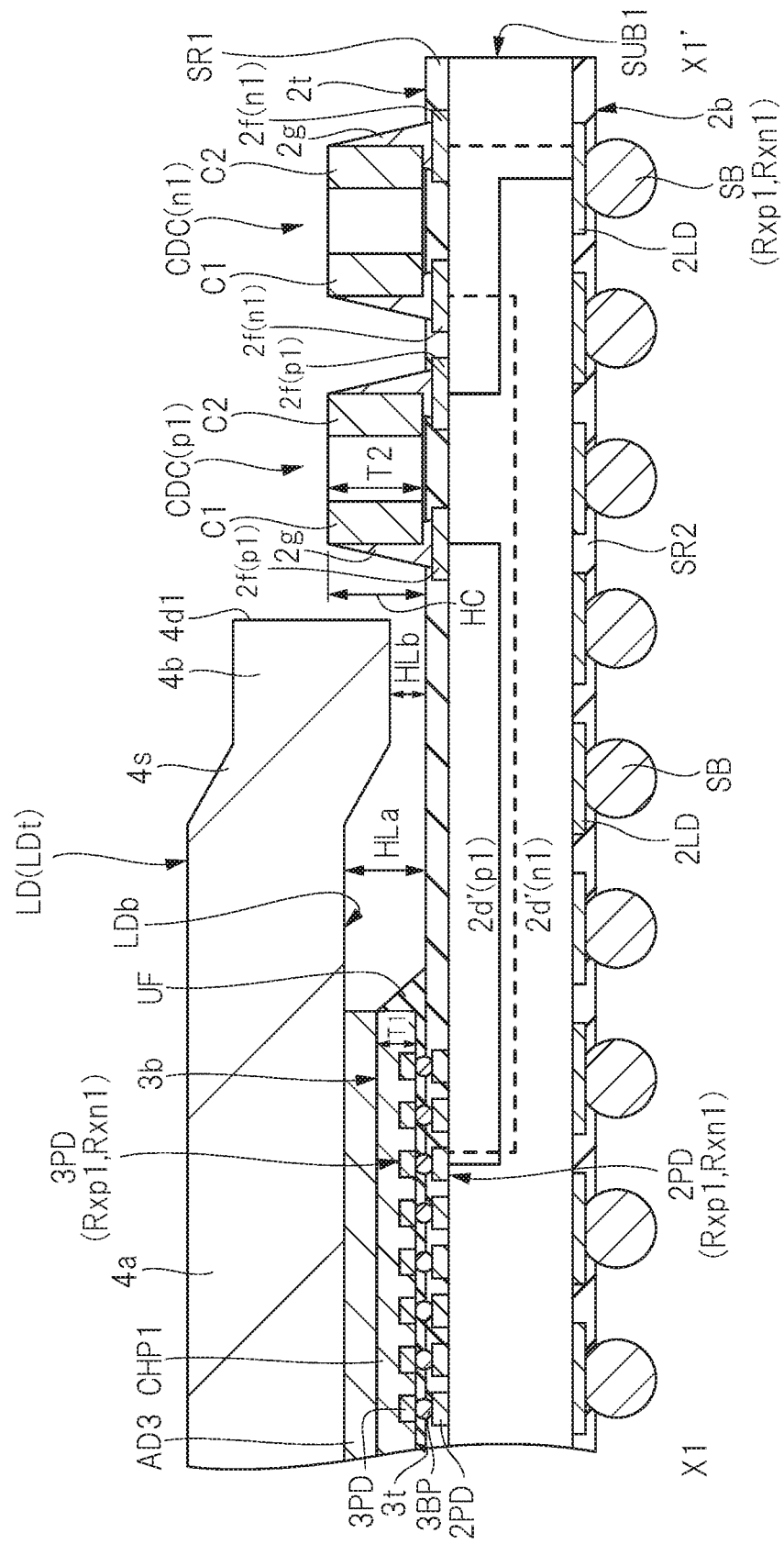
FIG. 7 is cross-sectional view of a main part along line X1-X1' of FIG. 3.
Figure 9:
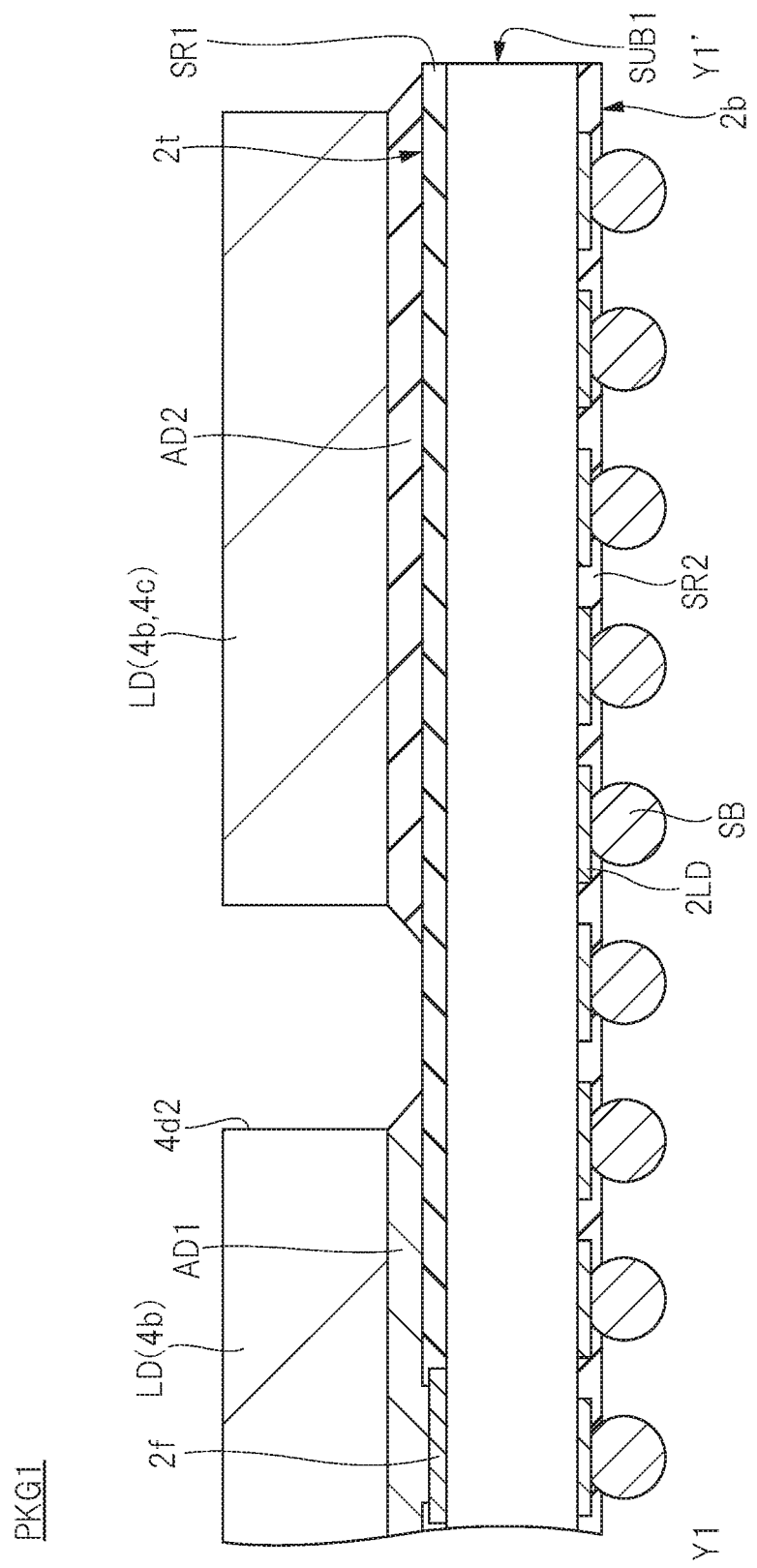
FIG. 9 is a cross-sectional view of a main part along line Y1-Y1' of FIG. 3.

FIG. 7 is cross-sectional view of a main part along line X1-X1' of FIG. 3, and FIG. 9 is cross-sectional view of a main part along line X2-X2' of FIG. 3.

However, since the cross-sectional views along the line X1-X1' and the line X2-X2' in FIG. 3 are symmetrical with respect to the center line of the semiconductor device in the X direction, the right half region is shown in FIGS. 7 and 9, for example.

Figure 8:
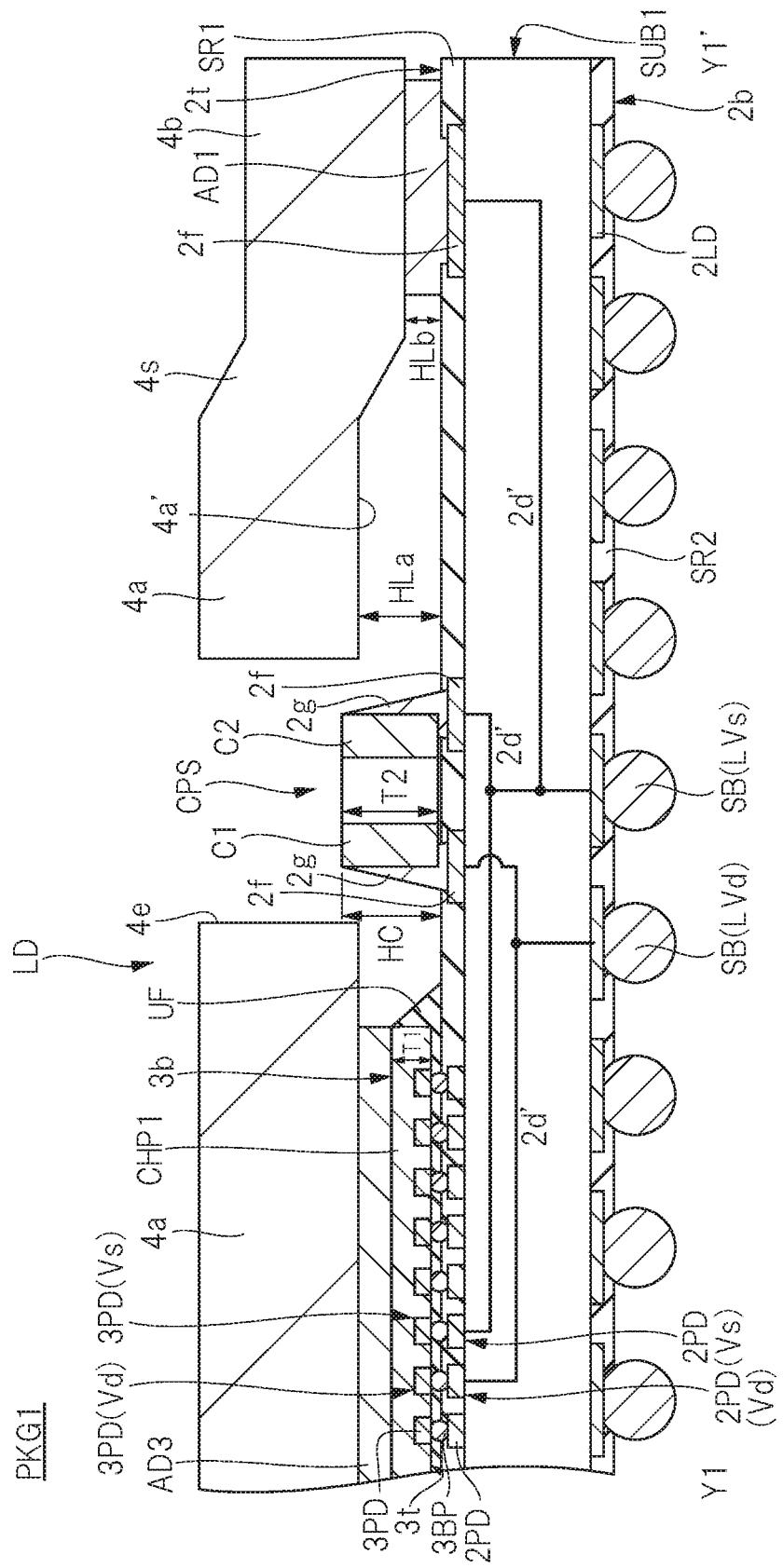
FIG. 8 is a cross-sectional view of a main part along line X2-X2' of FIG. 3.

FIG. 8 is cross-sectional view of a main part along line Y1-Y1' of FIG. 3.

However, since the cross-sectional view along the line Y1-Y1' in FIG. 3 is symmetrical with respect to the center line of the semiconductor device in the Y direction, FIG. 8 shows, for example, an upper half region.

Figure 10:
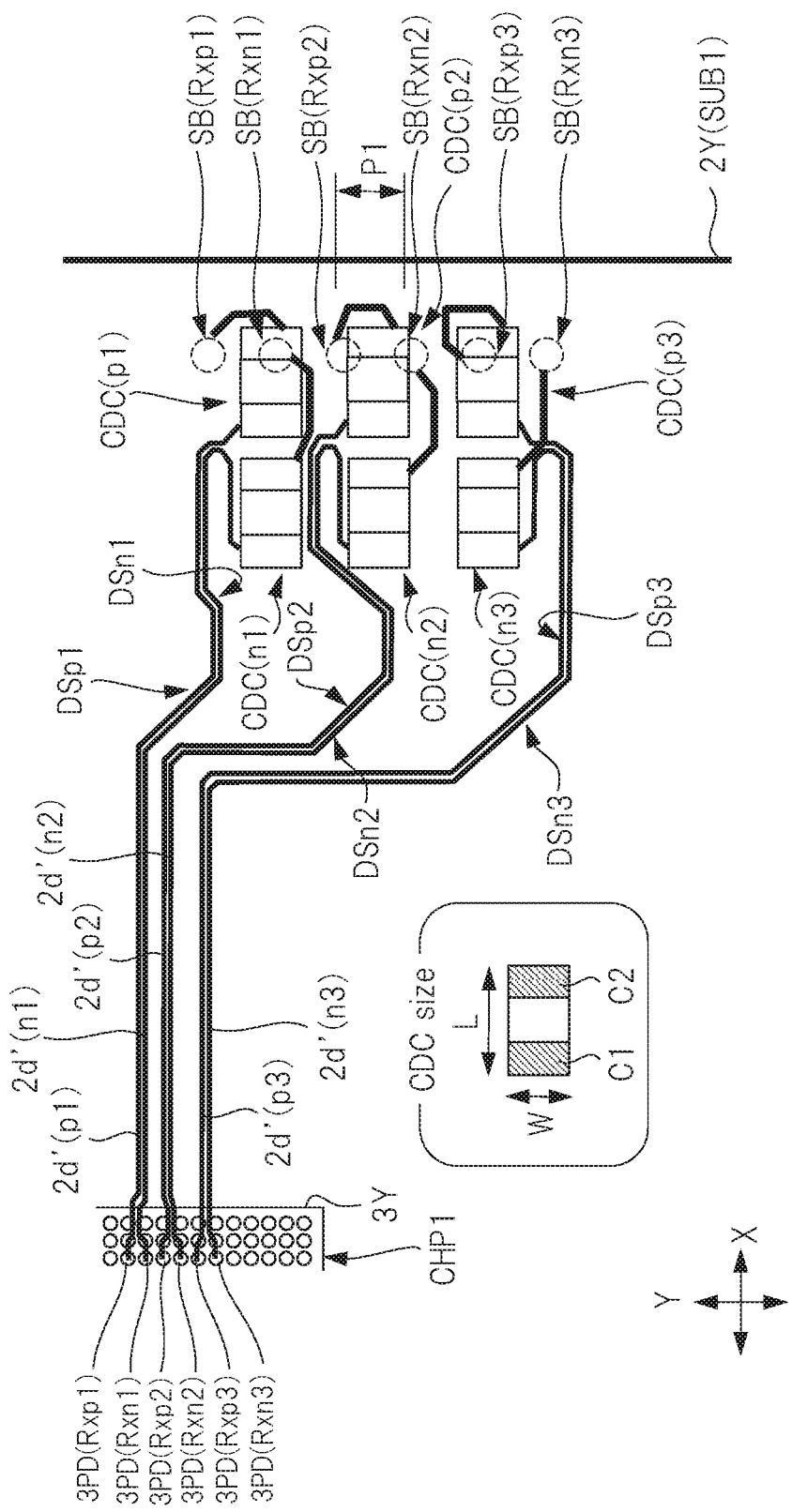
FIG. 10 is plan view of wiring for connecting electrodes of a semiconductor chip and solder balls on a wiring substrate.
Figure 11:
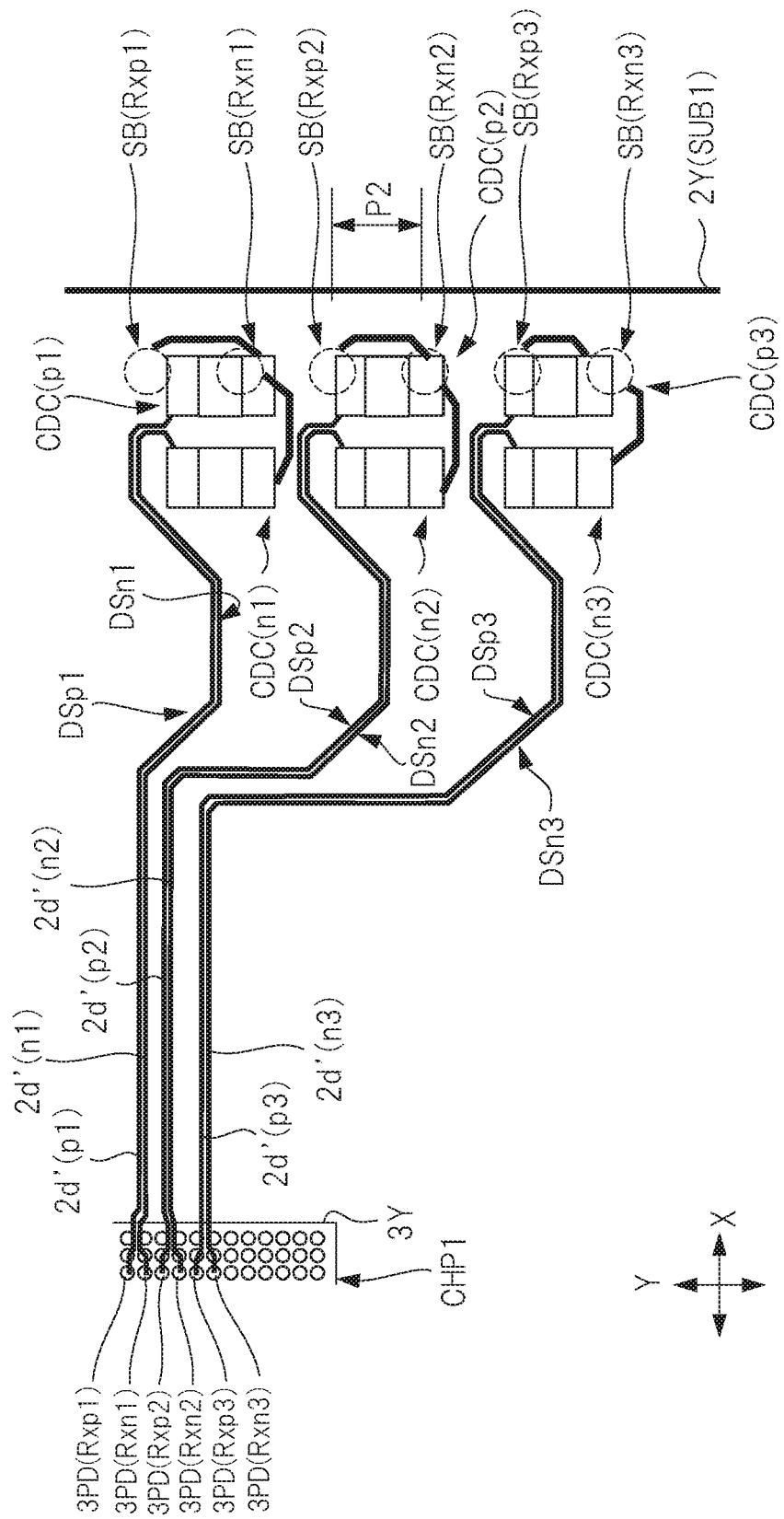
FIG. 11 is plan view of wiring connecting electrodes of a semiconductor chip as a comparative example and solder balls on a wiring substrate.

FIG. 10 is plan view of wiring connecting electrodes of a semiconductor chip and solder balls on a wiring substrate, and FIG. 11 is plan view of wiring connecting electrodes of a semiconductor chip and solder balls on a wiring substrate, which is a comparative example.

As shown in FIG. 3, the semiconductor device PKG1 includes a rectangular wiring substrate SUB1, a rectangular semiconductor chip CHP1, a plurality of capacitors CPS and CDC, and a substantially rectangular lid LD.

The wiring substrate SUB1 and the lid LD have substantially the same size and are larger than the size of the semiconductor chip CHP1.

The wiring substrate SUB1 having a rectangular shape in plan view has an upper surface 2t, and the upper surface 2t includes two sides 2X extending in the X direction and two sides 2Y extending in the Y direction perpendicular to the X direction. The semiconductor chip CHP1 is mounted on the center portion of the upper surface 2t of the wiring substrate SUB1.

The quadrangular semiconductor chip CHP1 in plan view includes two sides 3X extending in the X direction and two sides 3Y extending in the Y direction.

An underfill resin UF is provided so that the underfill resin UF contacts the semiconductor chip CHP1 and surrounds the periphery of the semiconductor chip CHP1.

A plurality of capacitors CDCs and CPSs are mounted on the upper surface 2t of the wiring substrate SUB1.

The plurality of capacitors CDC and CPS are capacitor components called chip capacitors having two terminals at both ends of a rectangular parallelepiped.

A plurality of capacitors CDCs are arranged between the semiconductor chip CHP1 and one side 2Y extending in the Y-direction.

The plurality of capacitors CDCs are disposed closer to one side 2Y than the semiconductor chip CHP1.

The plurality of capacitors CDC are arranged in a matrix, e.g., two rows in the X direction and nine columns in the Y direction, for a total of eighteen capacitors CDC.

In the two capacitors CDC arranged in the X direction, the two terminals of each capacitor CDC are aligned in the X direction.

That is, the four terminals of the two capacitors CDC arranged in the X direction are aligned in the X direction.

In other words, in plan view, the long side of the rectangular capacitor CDC is arranged along the X direction, and the short side thereof is arranged along the Y direction.

Similarly, between the semiconductor chip CHP1 and the other side 2Y extending in the Y direction, a plurality of capacitors CDC are arranged in a matrix-like manner, for example, two rows in the X direction and nine columns in the Y direction, and a total of eighteen capacitors CDC are arranged between the semiconductor chip CHP1 and the other side 2Y extending in the Y direction.

For example, a plurality of capacitors CDC arranged between the semiconductor chip CHP1 and one side 2Y extending in the Y direction are connected to the high-speed transmission path SGPH for the signal transmission rate 56 Gbps, and a plurality of capacitors CDC arranged between the semiconductor chip CHP1 and the other side 2Y extending in the Y direction are connected to the high-speed transmission path SGPH for the signal transmission rate 25 Gbps.

Between the semiconductor chip CHP1 and one side 2X extending in the X direction, a plurality of capacitors CPS are arranged in a row along the X direction.

The plurality of capacitors CPSs are disposed closer to the semiconductor chip CHP1 than one side 2X.

A total of five capacitors CPS are arranged at predetermined intervals in the X direction.

The two terminals of each capacitor CPS are aligned in the Y direction.

In other words, in plan view, the long side of the rectangular capacitor CPS is arranged along the Y direction, and the short side thereof is arranged along the X direction.

Similarly, a plurality of capacitors CPS are arranged in a line along the X direction between the semiconductor chip CHP1 and the other side 2X extending in the X direction.

As shown in FIG. 3, the upper surfaces 2t of the semiconductor chip CHP1 and the wiring substrate SUB1 are covered with a lid LD.

The quadrangular lid LD in plan view includes two sides 4X extending in the X direction and two sides 4Y extending in the Y direction.

Since the lid LD is chamfered at the intersection of the side 4X and the side 4Y, the semiconductor chip CHP1 can be said to be substantially rectangular in plan view.

The lid LD includes a heat radiating portion 4a, a flange portion 4b surrounding the periphery of the heat radiating portion 4a, and an inclined portion 4s between the heat radiating portion 4a and the flange portion 4b.

The radiator 4a includes an opening portion 4e for exposing a plurality of capacitors CPS arranged between the semiconductor chip CHP1 and one side 2X, and an opening portion 4e for exposing a plurality of capacitors CPS arranged between the semiconductor chip CHP1 and the other side 2X.

In plan view, the two opening portions 4e are located on the outer side of the semiconductor chip CHP1 without overlapping with the semiconductor chip CHP1.

The flanged portion 4b has a notch portion 4d1 exposing a plurality of capacitors CDC arranged between the semiconductor chip CHP1 and one side 2Y on a part of one side 4Y, and has a notch portion 4d1 exposing a plurality of capacitors CDC arranged between the semiconductor chip CHP1 and the other side 2Y on a part of the other side 4Y.

Further, the flange portion 4b is provided with two notches 4d2 on each of the sides 4X extending in the X direction.

The notched portion 4d1 is a concave portion from the side 4Y toward the heat radiating portion 4a, and the notched portion 4d2 is a concave portion from the side 4X toward the heat radiating portion 4a.

Further, the flanges 4b are provided with four corner portions 4c, and at the corner portions 4c, the lid LDs are bonded to the wiring substrate SUB1 via adhesive layers.

The corner portion 4c is defined as a region sandwiched between the notch portion 4d1 and the notch portion 4d2 in the flange portion 4b.

That is, as shown in FIG. 3, the corner portion 4c is provided with an adhesive layer region ADR2 which is a coating region of an insulating adhesive layer.

Further, between the two notches 4d2 in the X-direction, an adhesive layer region ADR1, which is a coating region of a conductive adhesive layer, is provided.

In other words, the flange part 4b of the riddle LD has an adhesive area ADR1 or ADR2 almost all the circumference except for the missing part 4d1 and 4d2.

As shown in FIG. 4, the wiring substrate SUB1 has an upper surface (surface, main surface, chip mounting surface, first main surface) 2t on which the semiconductor chip CHP1 is mounted, and a lower surface (surface, main surface, mounting surface, second main surface) 2b which is opposed to the upper surface 2t.

The wiring substrate SUB1 is an interposer (relay board) that electrically connects the semiconductor chip CHP1 mounted on the upper surface 2t and the wiring board MB1 (see FIG. 1) that is a motherboard (mounting board) to each other.

The wiring substrate SUB1 has a plurality of wiring layers WL1, WL2, WL3, WL4, WL5, WL6, WL7, WL8, WL9, and WL10 (10 layers in the embodiment shown in FIG. 4) for electrically connecting the terminal on the upper surface 2t side, which is the chip-mounting surface, and the terminal on the lower surface 2b side, which is the chip-mounting surface.

Each wiring layer has a conductor pattern such as a wiring which is a path for supplying an electric signal or electric power.

An insulating layer 2e is disposed between the wiring layers.

Each wiring layer is electrically connected via a via 2v, which is an interlayer conductive path penetrating the insulating layer 2e, or through-hole wiring 2THW.

In addition, most of the wiring layer WL1 disposed on the uppermost surface 2t side of the plurality of wiring layers is covered with the insulating layer SRI which is a solder resist film.

In addition, most of the wiring layer WL10 disposed on the lowermost surface 2b of the plurality of wiring layers is covered with the insulating layer SP2 which is a solder resist film.

The wiring substrate SUB1 is formed, for example, by laminating a plurality of wiring layers on the upper surface 2Ct and the lower surface 2Cb of an insulating layer (core material, core insulating layer) 2CP made of glass cloth by a build-up method.

The wiring layer WL5 on the upper surface 2Ct side of the insulating layer 2CR and the wiring layer WL6 on the lower surface 2Cb side are electrically connected via a plurality of through-hole wirings 2THW embedded in a plurality of through-holes provided so as to pass through one of the upper surface 2Ct and the lower surface 2Cb to the other.

A plurality of pads (terminals, bonding pads, bonding leads, and semiconductor chip connecting terminals) 2PD electrically connected to the semiconductor chip CHP1 are formed on the upper surface 2t of the wiring substrate SUB1.

On the lower surface 2b of the wiring substrate SUB1, a plurality of lands 2LD, which are external input/output terminals of the semiconductor device PKG1, are formed.

The plurality of pads 2PD and the plurality of lands 2LD are electrically connected to each other via wirings 2d, vias 2v, and through-hole wirings 2THW formed on the wiring substrate SUB1.

In the examples shown in FIG. 4, the wiring substrate SUB1 shows a wiring board in which a plurality of wiring layers are stacked on the upper surface 2Ct side and the lower surface 2Cb side of the insulating layer 2CR, which is a core material.

However, as a modification to FIG. 4, a so-called coreless substrate may be used in which the insulating layer 2CR made of a hard material such as a core material is not provided, and conductor patterns such as the insulating layer 2e and the wiring 2d are formed by stacking in order.

When the coreless substrate is used, the through-hole wiring 2THW is not formed, and each wiring layer is electrically connected via the via 2v.

Although FIG. 4 exemplarily shows a wiring substrate SUB1 having 10 wiring layers, a wiring board having 11 or more wiring layers or 8 or less wiring layers may be used as a modification, for example.

In the example shown in FIG. 4, solder balls (solder material, external terminals, electrodes, and external electrodes) SB are connected to each of the plurality of lands 2LD.

The solder balls SB are conductive members that electrically connect the plurality of terminals (not shown) on the wiring board MB1 and the plurality of lands 2LD when the semiconductor device PKG1 is mounted on the wiring board MB1 shown in FIG. 1.

The solder ball SB is, for example, an Sn—Pb solder material containing lead (Pb), or a solder material made of a so-called lead-free solder that does not substantially contain Pb.

Examples of lead-free solder include, for example, tin (Sn), tin-bismuth (Sn—Bi), tin-copper-silver (Sn—Cu—Ag), tin-copper (Sn—Cu), and the like.

Here, the lead-free solder means a solder in which the content of lead (Pb) is 0.1 wt % or less, and this content is determined as a standard of the RoHS (Restriction of Hazardous Substances) command.

As shown in FIG. 5, the plurality of solder balls SB are arranged in a matrix.

Although not shown in FIG. 5, a plurality of lands 2LD (see FIG. 4) to which a plurality of solder balls SB are bonded are also arranged in a matrix form.

In this manner, a semiconductor device in which a plurality of external terminals (solder balls SB and lands 2LD) are arranged in a matrix on the mounting surface of the wiring substrate SUB1 is referred to as an area-array type semiconductor device.

The area array-type semiconductor device can effectively utilize the mounting surface (lower surface 2b) of the wiring substrate SUB1 as a space for arranging external terminals, which is preferable in that an increase in the mounting area of the semiconductor device can be suppressed even if the number of external terminals increases.

In other words, a semiconductor device in which the number of external terminals increases with higher functionality and higher integration can be mounted in a space-saving manner.

The semiconductor device PKG1 includes a semiconductor chip CHP1 mounted on the wiring substrate SUB1.

As shown in FIG. 7, the semiconductor chip CHP1 includes a front surface (main surface, upper surface) 3t and a back surface (main surface, lower surface) 3b which is opposed to the front surface 3t.

As shown in FIG. 3, the semiconductor chip CHP1 has a rectangular outer shape having a plane area smaller than that of the wiring substrate SUB1 in plan view.

In the embodiment shown in FIG. 3, the semiconductor chip CHP1 is mounted on the central portion of the upper surface 2t of the wiring substrate SUB1, and each of the four sides 3X and 3Y of the semiconductor chip CHP1 extends along each of the four sides 2X and 2Y of the wiring substrate SUB1.

As shown in FIG. 6, a plurality of electrodes (pads, electrode pads, bonding pads) 3PD are arranged in a matrix on the front surface 3t of the semiconductor chip CHP1.

In addition, in the embodiment shown in FIG. 7, the semiconductor chip CHP1 is mounted on the wiring substrate SUB1 with the front surface 3t facing the upper surface 2t of the wiring substrate SUB1.

Such a mounting method is called a face-down mounting method or a flip-chip connection method.

Although not shown, a plurality of semiconductor elements (circuit elements) are formed on the main surface of the semiconductor chip CHP1 (more specifically, a semiconductor element forming area provided on an element forming surface of a semiconductor substrate which is a base material of the semiconductor chip CHP1).

The plurality of electrodes 3PD are electrically connected to the plurality of semiconductor elements via wirings (not shown) formed in wiring layers disposed inside the semiconductor chips CHP1 (in detail, between the front surfaces 3t and semiconductor element forming regions (not shown)).

The semiconductor chip CHP1 (more specifically, the base material of the semiconductor chip CHP1) is made of, for example, silicon (Si).

An interlayer insulating film covering the base material and the wirings of the semiconductor chip CHP1 is formed on the front surface 3t, and a part of each of the plurality of electrodes 3PD is exposed from the interlayer insulating film in an opening portion formed in the interlayer insulating film.

Here, the wiring or the wiring layer is made of, for example, a metal film of copper (Cu) or the like, and the interlayer insulating film for insulating the plurality of wiring layers is made of a Low-k film or the like.

Each of the plurality of electrodes 3PD is made of a metal film, and in the present embodiment, is made of aluminum (Al), for example.

In addition, as shown in FIG. 7, the plurality of electrodes 3PD are respectively connected to the protrusion electrodes 3BP, and the plurality of electrodes 3PD of the semiconductor chip CHP1 and the plurality of pads 2PD of the wiring substrate SUB1 are electrically connected to each other via the plurality of protrusion electrodes 3BP.

The protruding electrodes (bump electrodes) 3BP are metallic members (conductive members) formed so as to protrude above the surfaces 3t of the semiconductor chips CHP1.

In the present embodiment, the protruding electrode 3BP is a so-called solder bump in which a solder material is laminated on the electrode 3PD via an under-bump metal film.

As the base metal film, for example, a laminated film in which titanium (Ti), copper (Cu), and nickel (Ni) are laminated from the connection surface side with the electrode 3PD (in some cases, a gold (Au) film is further formed on the nickel film) can be exemplified.

As a solder material constituting the solder bump, a solder material containing lead or a lead-free solder can be used, similarly to the above-described solder ball SB.

When the semiconductor chip CHP1 is mounted on the wiring substrate SUB1, solder bumps are formed in advance on both of the plurality of electrodes 3PD and the plurality of pads 2PD, and the solder bumps are contacted with each other by performing a heat treatment (reflow treatment), whereby the solder bumps are integrated to form the protruding electrodes 3BP.

As a modification to the present embodiment, a pillar bump (columnar electrode) in which a solder film is formed on the tip surface of a conductor pillar made of copper (Cu) or nickel (Ni) may be used as the projection electrode 3BP.

As shown in FIG. 7, an underfill resin UF is disposed between the semiconductor chip CHP1 and the wiring substrate SUB1.

The underfill resin UF is disposed so that the underfill resin UF closes a space between the surface 3t of the semiconductor chip CHP1 and the upper surface 2t of the wiring substrate SUB1.

The underfill resin UF is made of an insulating (non-conductive) material (e.g., a resin material), and is disposed so as to seal the electrical connecting portions (the bonding portions of the plurality of protruding electrodes 3BP) of the semiconductor chip CHP1 and the wiring substrate SUB1.

In this manner, by covering the bonding portions between the plurality of protrusion electrodes 3BP and the plurality of pads 2PD with the underfill resin UF, it is possible to alleviate the stresses generated in the electrically connecting portions between the semiconductor chips CHP1 and the wiring substrate SUB1.

That is, it is possible to alleviate the stress generated in the bonding portion between the plurality of electrodes 3PD and the plurality of protruding electrodes 3BP of the semiconductor chip CHP1 and the stress generated in the bonding portion between the plurality of protruding electrodes 3BP and the plurality of pads 2PD of the wiring substrate SUB1.

Furthermore, the main surface of the semiconductor chips CHP1 on which the semiconductor elements are formed can be protected.

In addition, in the embodiment shown in FIG. 7, a lid (heat sink) LD is attached to the back surface 3b of the semiconductor chip CHP1.

The lid LD is, for example, a metallic plate having a thermal conductivity higher than that of the wiring substrate SUB1, and the lid LD has a function of discharging heat generated in the CHP1 of the semiconductor chip to the outside.

The lid LD is made of, for example, a metal material such as copper (Cu) or aluminum (Al), and can have a thickness of 0.3 to 3.0 mm, and in the present embodiment, the thickness is, for example, 1 mm.

The lid LD is attached to the back surface 3b of the semiconductor chip CHP1 via the adhesive layer AD3.

Adhesive AD3, for example, has a higher thermal conductivity than underfill resin UF by containing, for example, a large number of metal particles and fillers (e.g., alumina).

As shown in FIGS. 3 and 7, the semiconductor chip CHP1 is bonded to the heat radiating portion 4a of the lid LD.

The heat radiating portion 4a has a convex shape with respect to the flange portion 4b, and the height HLa of the heat radiating portion 4a is higher than the height HLb of the flange portion 4b (H1a>HLb).

Here, the height HLa of the heat radiating portion 4a is a distance from the upper surface 2t of the wiring substrate SUB1 to the back surface LDb of the heat radiating portion 4a, and the height HLb of the flange portion 4b is a distance from the upper surface 2t of the wiring substrate SUB1 to the back surface LDb of the flange portion 4b.

As shown in FIG. 7, the lid LD has a notch 4d1 in the flange 4b, and two capacitors CDC(p1) and CDC(n1) are mounted on the upper surface 2t of the wiring substrate SUB1 exposed from the lid LD in the notch 4d1.

Each capacitor CDC has terminals C1 and C2 at both longitudinal ends thereof, and each of the terminals C1 and C2 is connected to an electrode 2f of the wiring substrate SUB1 by a bonding material 2g such as solder.

That is, the electrode 2f to which the terminal C1 of the capacitor CDC(p1) is connected is electrically connected to the pad 2PD(Rxp1) via the wiring 2d(p1) in the wiring substrate SUB1, and is electrically connected to the electrode 3PD(Rxp1) of the semiconductor chip CHP1 via the projection electrode 3BP.

The electrodes 2f to which the terminals C2 of the capacitors CDC(p1) are connected are electrically connected to the lands 2LD and the solder balls SB(Rxp1) via the wirings 2d'(p1) in the wiring substrate SUB1.

The capacitor CDC(p1) is connected in series between the electrodes 3PD(Rxp1) of the semiconductor chip CHP1 and the corresponding solder balls SB(Rzp1).

Here, the wiring 2d'(p1) includes the wiring 2d, the via 2v, and the through-hole wiring 2THW in the wiring substrate SUB1.

In FIG. 7, a wire 2d'(n1) indicated by a broken line indicates the connections between the electrodes 3PD(Rxn1)

of the semiconductor chip CHP1 and the solder balls SB(Rxn1) arranged in the back of the semiconductor chip Rzn1.

FIG. 7 corresponds to the first pair of differential signal transmission paths DSp1 and DSn1 shown in FIG. 10, which will be described later.

In the present embodiment, since the thickness T1 of the semiconductor chip CHP1 is made thinner than the thickness T2 of the capacitor CDC, the height HC of the capacitor CDC becomes higher than the height HLa of the heat radiating portion 4a, and it becomes difficult to accommodate the capacitor CDC in the space between the lid LD and the wiring substrate SUB1.

However, by arranging the plurality of capacitors CDC in the notched portion 4d1 of the lid LD, the capacitor CDC can be mounted on the upper surface 2t of the wiring substrate SUB1 without short-circuiting between the terminals C1 and C2 of the capacitor CDC by the lid LD.

As described with reference to FIG. 2, the capacitor CDC is connected in series in the high-speed transmission path SGPH, and the capacitor CDC has a function of cutting DC components included in the AC signal in the input signal input to the semiconductor chip CHP1 via the solder ball SB.

By mounting the capacitor CDCs on the wiring substrate SUB1, noises in inputted signals can be reduced.

This is because, if the capacitor CDC is formed on the circuit board MB instead of the semiconductor device PKG1, there is a high possibility that the input signal will be noisy between the capacitor CDC and the semiconductor device PKG1.

Here, the capacitor CDC indicates both the capacitor CDC(p1) and the capacitor CDC(n1) shown in FIG. 7.

Further, as shown in FIG. 3, the capacitor CDC is arranged in the peripheral portion (or end portion) of the wiring substrate SUB1 by providing the notch portion 4d1 on the side 4Y of the lid LD and arranging the capacitor CDC in the notch portion 4d 1.

The capacitors CDCs are disposed closer to the side 2Y than the semiconductor chip CHP1.

For example, it is conceivable to provide an opening portion in the lid LD and arrange the capacitor CDC in the opening portion, but arranging the capacitor CDC in the notched portion 4d1 of the side 4Y enables the capacitor CDC to be arranged more in the peripheral portion of the wiring substrate SUB1.

By arranging the capacitor CDCs in the peripheral portion of the wiring substrate SUB1, the degree of freedom in laying out the wiring 2d on the wiring substrate SUB1 is improved, and accordingly, the electric performance of the semiconductor device PKG1 is also improved.

This is because the wiring 2d in the wiring substrate SUB1 extends radially from the central portion in which the semiconductor chip CHP1 is mounted to the peripheral portion, so that the wiring density is higher in the central portion, and the wiring density is lower in the central portion to the peripheral portion.

As shown in FIG. 8, the capacitor CPS is mounted on the wiring substrate SUB1 so that the capacitor CPS is exposed from the opening portion 4e provided in the heat radiating portion 4a of the lid LD.

Similar to the capacitor CDC, the height HC of the capacitor CPS is higher than the height HLa of the radiator 4a, but by arranging the capacitor CPS in the opening portion 4e of the lid LD, the capacitor CPS can be mounted on the upper surface 2t of the wiring substrate SUB1 without short-circuiting between the terminals C1 and C2 of the capacitor CPS due to the lid LD.

As shown in FIG. 8, the electrode 2f to which the terminal C1 is connected is electrically connected to the power supply potential pad 2PD(Vd) via the wiring 2d in the wiring substrate SUB1, is electrically connected to the power supply potential electrode 3PD(Vd) of the semiconductor chip CHP1 via the projection electrode 3BP, and is further connected to the power supply potential land LVd and the solder ball SB via the wiring 2d'.

The electrode 2f to which the terminal C2 is connected is electrically connected to the pads 2PD for the reference potential via the wiring 2d in the wiring substrate SUB1, is electrically connected to the electrodes 3PD for the reference potential of the semiconductor chip CHP1 via the protruding electrodes 3BP, and is further connected to the lands LVs for the reference potential and the solder balls SB via the wiring 2d'.

As described with reference to FIG. 3, the capacitor CPS is disposed closer to the semiconductor chip CHP1 than the one side 2X.

By arranging the capacitor CPS close to the semiconductor chip CHP1, the driving voltage, which is the difference between the power supply potential VDD of the semiconductor chip CHP1 and the reference voltage VSS, can be stabilized.

As shown in FIG. 8, the flanges 4b of the lid LDs are connected to the electrodes 2f provided on the wiring substrate SUB1 via conductive adhesive layers AD1.

The electrode 2f to which the lid LD is connected is connected to a solder ball SB to which a reference potential VSS is applied via a wiring 2d'.

By applying the reference potential VSS to the lid LD, the semiconductor chip CHP1 can be shielded, and the semiconductor chip CHP1 can be protected from a magnetic field or the like generated outside the semiconductor device PKG1.

Further, as shown in FIG. 3, in plan view, the rectangular capacitor CPS is arranged with its long side along the Y direction and its short side along the X direction.

In other words, the long side of the capacitor CPS extends in the Y direction perpendicular to the X direction, which is the extending direction of the side 3X of the semiconductor chip CHP1 sandwiching the capacitor CPS and the side 2X of the wiring substrate SUB1.

With such an arrangement, the degree of freedom in laying out the wiring 2d on the wiring substrate SUB1 can be improved.

In the case of the present embodiment, the two electrodes 2f to which the two terminals C and C2 of the capacitor CPS are connected can be arranged side by side along the extending direction (Y direction) of the wiring 2d.

However, when the long side of the capacitor CPS is arranged along the X direction, the two electrodes 2f to which the two terminals C1 and C2 of the capacitor CPS are connected must be arranged side by side in the X direction.

FIG. 9 is cross-sectional view of a main part along line X2-X2' of FIG. 3.

In FIG. 3, however, the adhesive layer regions ADR1 and ADR2, which are application regions of the adhesive layer, are shown, while in FIG. 9, the lid LD is shown bonded to the upper surface 2t of the wiring substrate SUB1.

As shown in FIG. 9, the adhesive layers AD1 and AD2 extend over the entire flange portion 4b of the lid LD.

However, as shown in FIG. 3, by providing the notch 4d2 on the side 4X of the lid LD, it is possible to prevent the insulating (non-conductive) adhesive layer AD2 and the conductive adhesive layer AD1 from contacting or mixing with each other.

Therefore, it is possible to prevent the adhesive strength of the adhesive layers AD1 and AD2 from decreasing.

The adhesive layer AD1 is made of, for example, epoxy resin or solder material containing a large number of metal particles such as silver, and the adhesive layer AD2 is made of, for example, epoxy resin.

FIG. 10 is plan view for explaining connections from the lands LDH of the semiconductor device PKG1 to the signal electrodes Rx of the semiconductor chips CHP1 in the high-speed transmission path SGPH shown in FIG. 2.

The signal SGR, which is an input signal shown in FIG. 1, is input to the land LDH of the semiconductor device PKG1 shown in FIG. 2, and is input to the signal electrodes Rx of the semiconductor chips CHP1 via the capacitor CDC.

In FIG. 10, the land LDH in FIG. 2 corresponds to the solder ball SB, and the signal electrode RX in FIG. 2 corresponds to the electrode 3PD.

FIG. 1$i$ is a comparative example of FIG. 10, in which the direction of the capacitor CDC is different.

In FIGS. 10 and 11, three pairs of high-speed transmission paths are shown, and each high-speed transmission path is composed of a pair of differential signal transmission paths DSp and DSn.

The first pair of differential signal transmission paths DSp1 and DSn1 and the constituent elements thereof are distinguished by attaching 1 to the end of the code, the second pair of differential signal transmission paths DSp2 and DSn2 and the constituent elements thereof are attached by attaching 2 to the end of the code, and the third pair of differential signal transmission paths DSp3 and DSn3 and the constituent elements thereof are attached by attaching 3 to the end of the code.

However, in the case where the first to third symbols are not distinguished from each other, 1 to 3 at the end of the code are excluded from the description.

The differential signal transmission path DSp1 of the first pair of differential signal transmission paths DSp1 and DSn1 is composed of solder balls SB(Rxp1)/wiring $2d'$(p1)/capacitor CDC(p1)/wiring $2d'$(p1)/electrode 3PD(Rzp1), and the differential signal transmission path DSn1 is composed of solder balls SB(Rxn1)/wiring $2d'$(n1)/capacitor CDC(n1)/wiring $2d'$(n1)/electrode 3PD(Rxn1).

Similarly, the differential signal transmission path DSp2 of the second pair of differential signal transmission paths DSp2 and DSn2 is composed of the solder ball SB(Rxp2)/wiring $2d'$(p2)/capacitor CDC(p2)/wiring $2d'$(p2)/electrode 3PD(Rzp2), and the differential signal transmission path DSn2 is composed of the solder ball SB(Rxn2)/wiring $2d'$(n2)/capacitor CDC(n2)/wiring $2d'$(n2)/electrode 3PD(Rxn2).

Similarly, the differential signal transmission path DSp3 of the third pair of differential signal transmission paths DSp3 and DSn3 is composed of the solder ball SB(Rxp3)/wiring $2d'$(p3)/capacitor CDC(p3)/wiring $2d'$(p3)/electrode 3PD(Rxp3), and the differential signal transmission path DSn3 is composed of the solder ball SB(Pxn3)/wiring $2d'$(n3)/capacitor CDC(n3)/wiring $2d'$(n3)/electrode 3PD(Rn3).

The wirings $2d'$(p1) and $2d'$(n1) of the first pair of differential signal transmission paths DSp1 and DSn1 are equal in length.

The same applies to the second pair of differential signal transmission paths DSp2 and DSn2 and the third pair of differential signal transmission paths DSp3 and DSn3.

The pair of solder balls SB (Rxp1) and SB (Rxn1), SB (Rxp2) and SB (Rxn2), and SB (Rxp3) and SB (Rzn3) are arranged adjacently to each other in the Y-direction at pitches P1.

These solder balls are assigned to the rows of the outermost solder balls SB shown in FIG. 5.

The capacitor CDC is a rectangle having a length L of the long side and a width W of the short side in plan view, and has terminals C1 and C2 at both ends in the long side direction.

The length L of the long side is larger than the width W of the short side (L>W).

The pair of capacitors CDC(p) and CDC(n) included in the pair of differential signal transmission paths DSp and DSn are adjacent to each other in the X direction, and the long sides thereof are arranged along the X direction.

Here, the X direction is a direction perpendicular to the extending direction of the side 3Y of the semiconductor chip CHP1 and the side 2Y of the wiring substrate SUB1 that sandwich the pair of capacitors CDC(p) and CDC(n).

As described above, since the pair of capacitors CDC(p) and CDC(n) are adjacent to each other in the X direction and the short sides are arranged along the Y direction, it is possible to reduce the area for configuring the pair of differential signal transmission paths DSp and DSn in the Y direction.

Therefore, the pitch P1 in the Y direction of the pair of solder balls SB(Pxp) and SB(Rxn) included in the pair of differential signal transmission paths DSp and DSn can be reduced, and the pitch of the solder balls SB can be narrowed.

Further, since the branch points of the wirings $2d'$(p) and $2d'$(n) of the pair of differential signal transmission paths DSp and DSn that run in parallel from the semiconductor chip CHP1 to the capacitors CDC(p) and CDC(n) are closer to the center portion of the wiring substrate SUB1 as compared with the case of FIG. 11, which will be described later, the wiring lengths of the wirings $2d'$(p) and $2d'$(n) can be reduced, and high-speed transmission of an input signal can be achieved.

On the other hand, in the comparative example shown in FIG. 11, since the pair of capacitors CDC(p) and CDC(n) are adjacent to each other in the X direction and the long sides thereof are arranged along the Y direction, it is understood that the region for configuring the pair of differential signal transmission paths DSp and DSn in the Y direction is enlarged as compared with FIG. 10.

Therefore, the pitch P2 of the pair of solder balls SB(Rxp) and SB(Rzn) included in the pair of differential signal transmission paths DSp and DSn is also increased as compared with FIG. 10, which is unsuitable for narrowing the pitch of the solder balls SB.

Further, since the branch points of the wirings $2d'$(p) and $2d'$(n) of the pair of differential signal transmission paths DSp and DSn running in parallel from the semiconductor chip CHP1 to the capacitors CDC(p) and CDC(n) are closer to the end portions of the wiring substrate SUB1 than in FIG. 10, the wiring lengths of the wirings $2d'$(p) and $2d'$(n) are increased as compared with FIG. 10.

The semiconductor device PKG1 of the present embodiment has the following features.

In plan view, the lid LD has a shape and an area substantially equal to those of the wiring substrate SUB1, and the flange portion 4$b$ of the lid LD is bonded to the wiring substrate SUB1 with the adhesive layer AD1 or the adhesive layer AD2 at substantially the entire periphery except for the notched portions 4$d$1 and 4$d$2.

Since the lid LD is formed of a metallic plate having higher stiffness than the wiring substrate SUB1, the warpage of the wiring substrate SUB1 can be reduced.

In addition, since the thickness of the semiconductor chip CHP1 flip-chip connected on the wiring substrate SUB1 is made thinner than the thickness of the capacitors CDC or CPS, even if warpage occurs on the wiring substrate SUB1, the thin semiconductor chip CHP1 follows the warpage, and the stresses applied to the electrically connected portions between the semiconductor chip CHP1 and the wiring substrate SUB1 can be relieved.

Therefore, it is possible to prevent cracks occurring in the interlayer insulating film in the CHP1 of the semiconductor chip from occurring.

A capacitor CDC mounted on the wiring substrate SUB1 is connected in series to the high-speed transmission path SGPH of the signal SGR inputted from the outside of the semiconductor device PKG1 to the semiconductor chip CHP1.

The capacitor CDC, which is thicker than the semiconductor chip CHP1, is disposed in the notch 4d1 provided in the lid LD, and is exposed from the lid LD.

Therefore, the capacitor CDC can be mounted on the wiring substrate SUB1 without short-circuiting between the terminals C1 and C2 of the capacitor CDC by the metallic lid LD.

Since the pair of capacitors CDC(p), CDC(n) connected to the pair of differential signal transmission paths DSp, DSn are arranged adjacent to each other in the X direction so that the short sides of the capacitors CDC(p) and CDC(n) are along the Y direction, the pitch P1 in the Y direction of the solder balls SB(Rxp) and SB(Rxn) connected to the pair of differential signal transmission paths DSp, DSn can be reduced.

In addition, the wiring length of the wirings 2d'(p) and 2d'(n) constituting the pair of differential signal transmission paths DSp and DSn can be reduced.

In addition, the degree of freedom in laying out the wiring 2d on the wiring substrate SUB1 is improved.

The capacitor CDC is disposed in the notch 4dl of the lid LD, and is disposed closer to the side 2Y of the wiring substrate SUB1 than the side 3Y of the semiconductor chip CHP1 sandwiching the capacitor CDC.

By arranging the capacitor CDCs in the peripheral portion of the wiring substrate SUB1, the degree of freedom in laying out the wiring 2d on the wiring substrate SUB1 is improved, and accordingly, the electric performance of the semiconductor device PKG1 is also improved.

The capacitor CPS connected between the power supply potential electrode Vd and the reference potential electrode Vs of the semiconductor chip CHP1 was mounted on the wiring substrate SUB1, and the capacitor CPS was disposed in the opening portion 4e provided in the lid LD.

The capacitor CPS, which is thicker than the semiconductor chip CHP1, is disposed in the opening portion 4e provided in the lid LD and is exposed from the lid LD.

Therefore, the capacitor CPS can be mounted on the wiring substrate SUB1 without short-circuiting between the terminals C1 and C2 of the capacitor CPS by the metallic lid LD.

The capacitor CPS is disposed in the opening portion 4e provided in the heat radiating portion 4a of the lid LD, and is disposed closer to the side 3X of the semiconductor chip CHP1 than the side 2X of the wiring substrate SUB1 sandwiching the capacitor CPC.

By arranging the capacitor CPS close to the semiconductor chip CHP1, the driving voltages of the semiconductor chip CHP1 can be stabilized.

By arranging the long sides of the capacitors CPS so as to extend in the Y-direction, the degree of freedom in laying out the wiring 2d on the wiring substrate SUB1 can be improved.

This is because the wiring 2d in the wiring substrate SUB1 extends radially from the central portion where the semiconductor chip CHP1 is mounted to the peripheral portion of the wiring substrate SUB1.

Since the lid LD is connected to the electrode 2f of the wiring substrate SUB1 and the reference potential VSS is applied to the electrode 2f, the lid LD has a shielding effect of protecting the semiconductor chip CHP1 from an external magnetic field.

Figure 12:
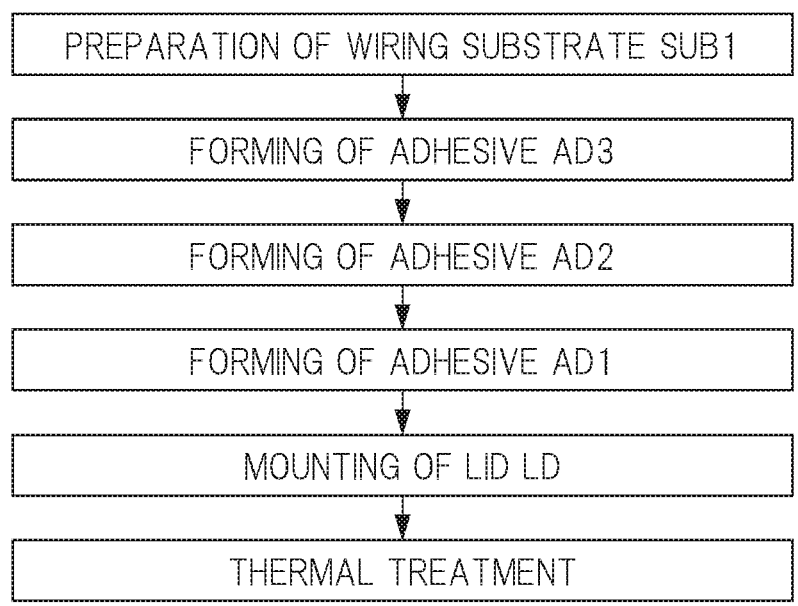
FIG. 12 is a flow chart showing a part of the manufacturing process of the semiconductor device shown in FIG. 3.
Figure 13:
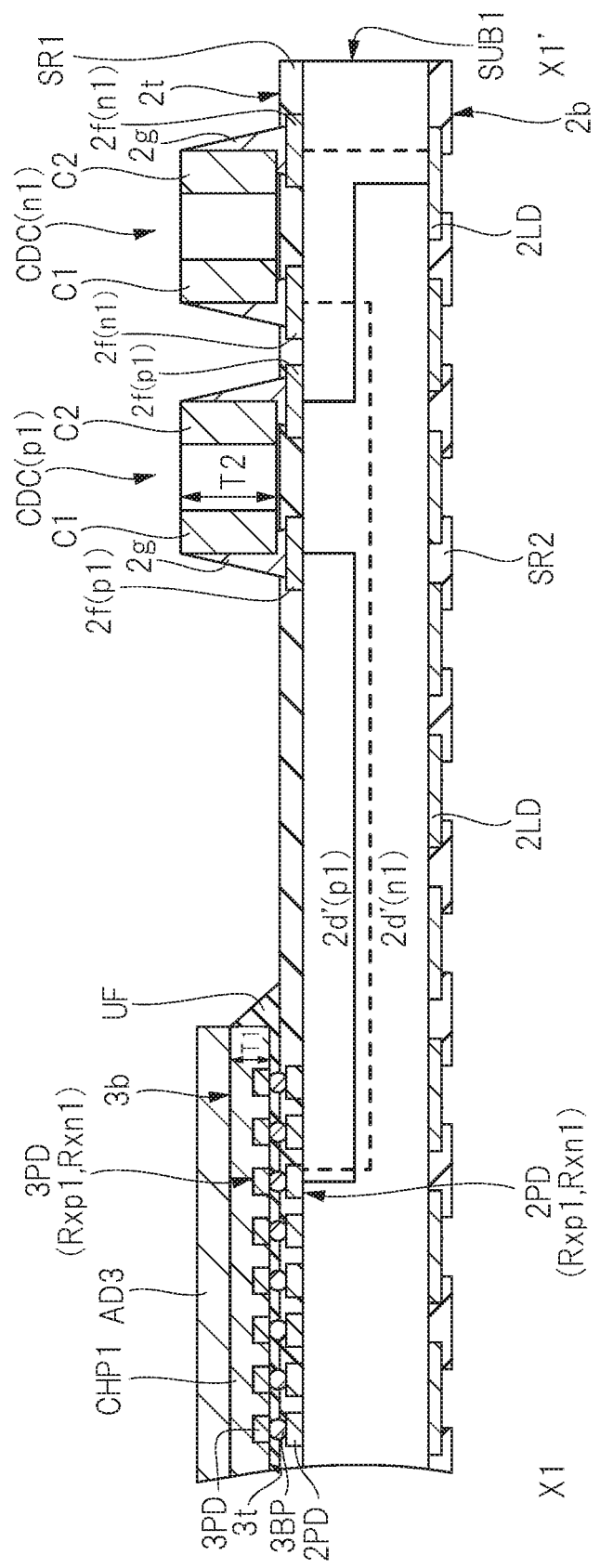
FIG. 13 is cross-sectional view of the semiconductor device shown in FIG. 3 during the manufacturing process.
Figure 14:
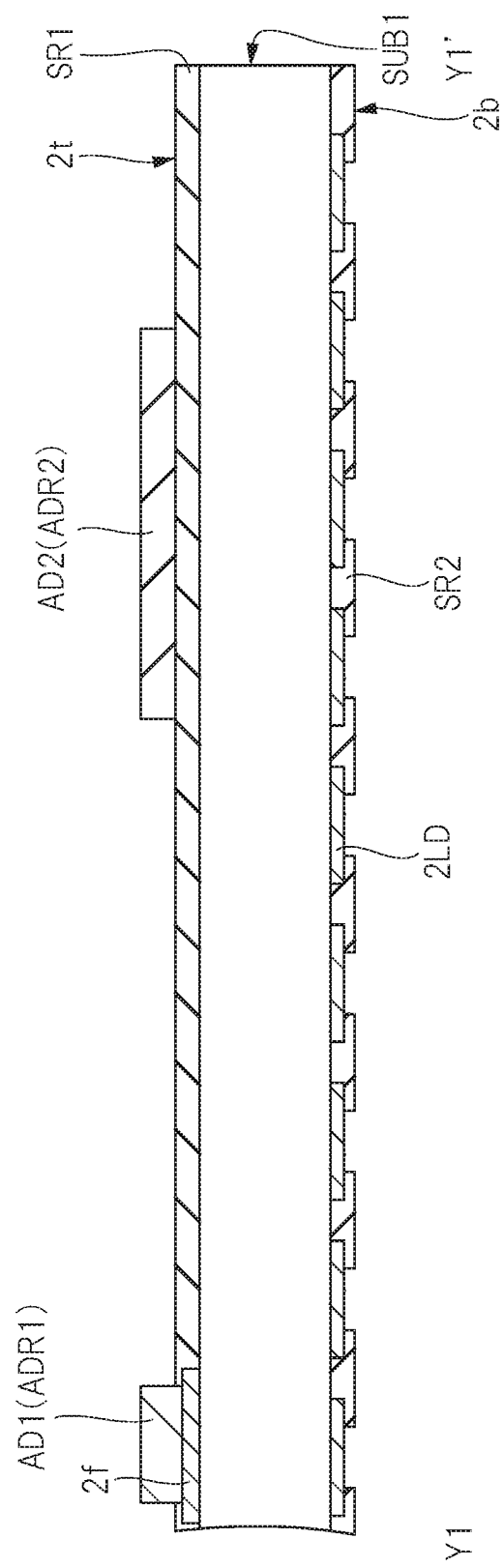
FIG. 14 is cross-sectional view of the semiconductor device shown in FIG. 3 during the manufacturing process.

FIG. 12 is a flow chart showing the manufacturing process of the semiconductor device shown in FIG. 3, and FIGS. 13 and 14 are cross-sectional views during the manufacturing process of the semiconductor device shown in FIG. 3.

First, as shown in FIG. 13, the wiring substrate SUB1 on which the semiconductor chip CHP1 and the capacitor CDC are mounted on the upper surface 2t is prepared.

At this stage, the underfill resin UF is filled between the semiconductor chip CHP1 and the wiring substrate SUB1.

Although not shown, the capacitor CPS is also mounted on the upper surface 2t of the wiring substrate SUB1.

Next, as shown in FIG. 13, the adhesive layer AD3 is applied on the back surface 3b of the semiconductor chip CHP1 to form the adhesive layer AD3.

The adhesive layer AD3 is a high thermal conductivity adhesive layer containing a large number of metal particles and fillers such as alumina, and has thermosetting properties.

The adhesive layer AD3 is, for example, a composite heat radiating material in which alumina is mixed with an insulating resin, and in addition to the high thermal conductivity resin, grease, gel, silicone material, carbon material, and the like are also applied to the adhesive layer AD3.

Next, as shown in FIG. 14, the adhesive layers AD2 and AD1 are applied to the adhesive layer regions ADR2 and ADR1 of the wiring substrate SUB1 to form the adhesive layers AD2 and AD1.

The adhesive layer AD2 is an insulating adhesive layer made of epoxy resin and has thermosetting properties.

The adhesive layer AD1 is a conductive adhesive layer made of an epoxy resin containing silver particles, for example, and has thermosetting properties.

The order of formation of the adhesive layers AD3 to AD1 is not particularly limited.

Next, as shown in FIGS. 7 to 9, after the lid LD is mounted on the wiring substrate SUB1, the adhesive layers AD1 to AD3 are cured by performing heat treatment at, for example, 150° C.

Here, as shown in FIGS. 3 and 9, the adhesive layer region ADR1 and the adhesive layer region ADR2 are separated by a notch portion 4d2 provided in the lid LD.

When the lid LD is mounted after the adhesive layers AD1 and AD2 are applied, the adhesive layers AD1 and AD2 are spread due to the weight of the lid LD, but since the notch portion 4d2 is provided in the lid LD, the two layers do not mix with each other.

In the notched portion 4d2, mixing of the adhesive layers AD1 and AD2 can be prevented by the surface tension of the adhesive layers AD1 and AD2.

Therefore, it is possible to prevent the adverse effect of the hardening inhibition or the lowering of the adhesiveness of the adhesive layers AD1 and AD2 caused by the mixing.

According to the method for manufacturing a semiconductor device of this embodiment, since the adhesive layers AD1 to AD3 can be cured by one heat treatment, the manufacturing process can be shortened.

In addition, by providing the notch 4d2 in the lid LD between the adhesive layer region ADR1 and the adhesive layer region ADR2, it is possible to prevent the conductive adhesive layer AD1 provided in the adhesive layer region ADR1 from mixing with the insulating adhesive layer AD2 provided in the adhesive layer region ADR2 in the step of adhering the lid LD to the wiring substrate SUB1, so that it is possible to improve the connection reliability between the lid LD and the wiring substrate SUB1.

Figure 15:
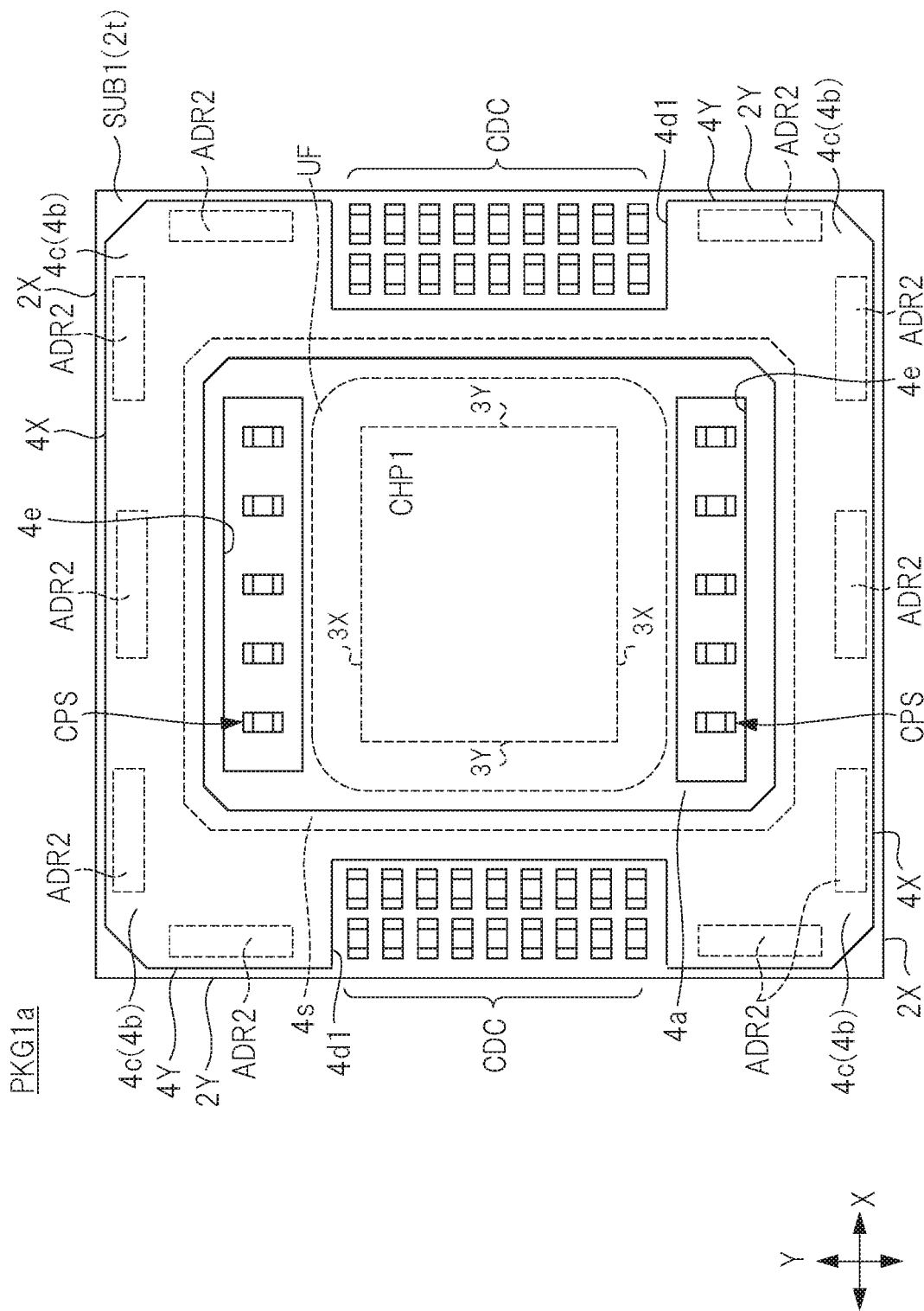
FIG. 15 is a top view of the semiconductor device of Modification 1.

FIG. 15 is a top view of a semiconductor device PKG1a of a first modification.

As shown in FIG. 3 or FIG. 8, in order to provide the lid LD with a shielding function, the lid LD was connected to the electrodes 2f of the wiring substrate SUB1 via a conductive adhesive layer in the adhesive layer area ADR1.

Variation 1 shows a structure in which the lid LD does not have a shield function.

The adhesive layer region ADR1 in FIG. 3 is the adhesive layer region ADR2, and the notch portion 4d2 is not provided.

Figure 16:
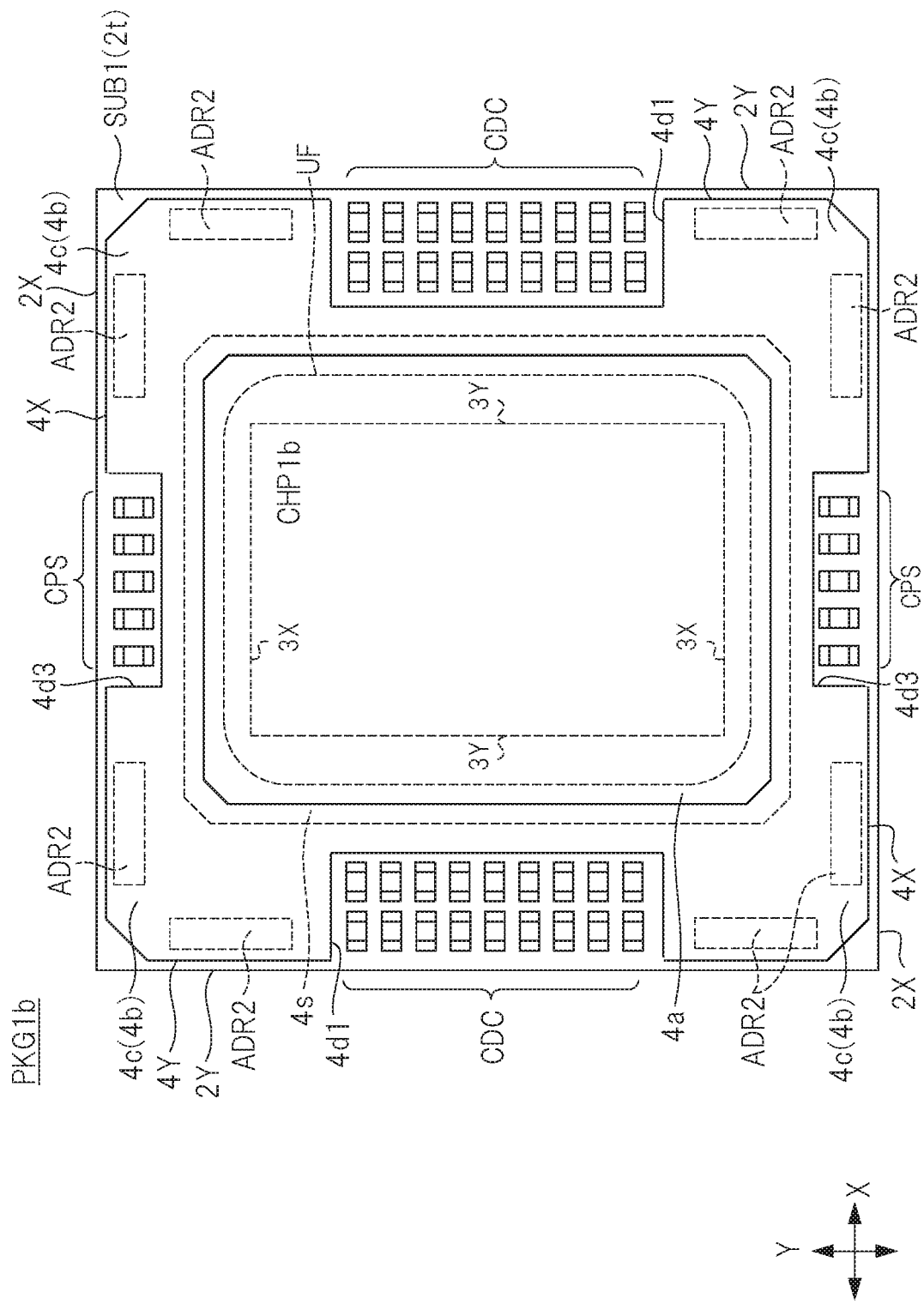
FIG. 16 is a top view of a semiconductor device of Modification 2.

FIG. 16 is a diagram of the semiconductor PKG1b of a second modification.

In the second modification, the capacitor CPS is disposed in the notch portion 4d3 provided on the side 4X of the lid LD.

Since the opening portion is not provided in the heat dissipation portion 4a of the lid LD, the area of the heat dissipation portion 4a can be increased as compared with the structure of FIG. 3, and the heat dissipation characteristics of the semiconductor chip CHP1b can be improved.

When the distance between the side 3X of the semiconductor chip CHP1b sandwiching the capacitor CPS and the side 2X of the wiring substrate SUB1 is small, for example, when the side 3Y of the semiconductor chip CHP1b is longer than the side 3X, it is useful to arrange the capacitor CPS in the notched portion 4d3 of the lid LD.

This is because a relatively wide area is required between the side 3X of the semiconductor chip CHP1b and the side 2X of the wiring substrate SUB1 when the capacitor CPS is arranged in the opening portion 4e as in the above embodiment.

When the distance between the side 3X of the semiconductor chip CHP1b sandwiching the capacitor CPS and the side 2X of the wiring substrate SUB1 is small, even if the capacitor CPS is disposed in the notch 4d3 of the lid LD, the driving voltages of the semiconductor chip CHPb can be stabilized because the capacitor CPS is close to the semiconductor chip CHP1b.

Further, by arranging the capacitor CPS in the peripheral portion of the wiring substrate SUB1, the degree of freedom in laying out the wiring 2d on the wiring substrate SUB1 is improved, and accordingly, the electric performance of the semiconductor device PKG1b is also improved.

The invention made by the present inventor has been described above in detail based on the embodiment, but the present invention is not limited to the embodiment described above, and it is needless to say that various modifications can be made without departing from the gist thereof.

Part of the contents described in the above embodiments will be described below.

APPENDIX 1

A method of manufacturing a semiconductor device comprising the steps of: (a) providing a wiring substrate including a first region on which a semiconductor chip is mounted, a second region in which an electrode is exposed, and a third region covered with an insulating layer on a back surface of the semiconductor chip in the first region; (b) forming a first adhesive layer on a back surface of the semiconductor chip in the second region, forming a conductive second adhesive layer on the electrode, and forming an insulating third adhesive layer on the insulating layer in the third region; (c) mounting a metallic lid comprising a notch on a main surface of the wiring substrate; (d) heat treating the first adhesive layer, the second adhesive layer, and the third adhesive layer to cure the first adhesive layer, the second adhesive layer, and the third adhesive layer; and (c) positioning the notch between the second region and the third region in the step.

What is claimed is:

1. A semiconductor device comprising:
    a wiring substrate having a first main surface, a second main surface opposite the first main surface, and a first side extending in a first direction;
    a semiconductor chip having 1) a front surface and 2) a rear surface opposite the front surface, the semiconductor chip being mounted on the first main surface of the wiring substrate;
    a first capacitor mounted on the first main surface of the wiring substrate except an area on which the semiconductor chip is mounted; and
    a lid disposed on the rear surface of the semiconductor chip via a first adhesive layer, the lid covering over the first main surface of the wiring substrate,
    wherein the lid includes a first lid side extending in the first direction such that the first lid side extends along the first side of the wiring substrate, and
    wherein, in plan view, the first lid side of the lid includes a first notched portion, wherein the first notched portion concaves from the first lid side of the lid toward a center portion of the lid to expose the first capacitor disposed on the first main surface of the wiring substrate.

2. The semiconductor device according to claim 1,
    wherein a thickness of the semiconductor chip is thinner than a thickness of the first capacitor in a thickness direction of the wiring substrate, and
    wherein the first capacitor is exposed from the lid.

3. The semiconductor device according to claim 2,
    wherein the wiring substrate includes a first external electrode formed on the second main surface,
    wherein the semiconductor chip includes a first electrode arranged on the front surface,
    wherein the first capacitor includes a first terminal pad and a second terminal pad,
    wherein the first electrode of the semiconductor chip is electrically connected with the first terminal pad of the first capacitor, and
    wherein the second terminal pad of the first capacitor is electrically connected with the first external electrode of the wiring substrate.

4. The semiconductor device according to claim 3, further comprising:
    a second electrode formed on the front surface of the semiconductor chip;
    a second capacitor having a third terminal pad and a fourth terminal pad, the second capacitor mounted on the first main surface of the wiring substrate in the first notched portion of the lid; and
    a second external electrode formed on the second main surface of the wiring substrate, wherein the second electrode of the semiconductor chip is electrically connected with the third terminal pad of the second capacitor, wherein the fourth terminal pad of the second capacitor is electrically connected with the second external electrode of the wiring substrate, and wherein a thickness of the second capacitor is greater than the thickness of the semiconductor chip in the thickness direction of the wiring substrate.

5. The semiconductor device according to claim 4, wherein a first input signal and a second input signal, which are a pair of differential input signals, are input to the semiconductor chip from outside of the semiconductor device, wherein the first input signal is input from the first external electrode of the wiring substrate to the first electrode of the semiconductor chip via the first capacitor, and wherein the second input signal is input from the second external electrode of the wiring substrate to the second electrode of the semiconductor chip via the second capacitor.

6. The semiconductor device according to claim 5, wherein the first external electrode is adjacent to the second external electrode in the first direction.

7. The semiconductor device according to claim 5, wherein the first and second terminal pads of the first capacitor and the third and fourth terminal pads of the second capacitor are arranged in a second direction orthogonal to the first direction.

8. The semiconductor device according to claim 3, wherein the lid overlaps the semiconductor chip, and includes:

a heat dissipation portion of which an area is greater than the semiconductor chip; and a flange portion, and wherein the first notched portion is formed in the flange portion.

9. The semiconductor device according to claim 3, wherein the semiconductor chip is attached to a second rear surface of the lid via adhesive layer, wherein the lid includes a heat dissipation portion and a flange portion, and wherein an interval from the first main surface of the wiring substrate to the second rear surface of the heat dissipation portion of the lid is greater than an interval from the first main surface to the second rear surface of the flange portion of the lid in the thickness direction.

10. The semiconductor device according to claim 9, wherein the flange portion includes a first portion and a second portion which sandwich the first notched portion in the first direction, and wherein the first portion and the second portion of the flange portion are adhered to the wiring substrate by a second adhesive layer which is an insulating adhesive.

11. The semiconductor device according to claim 10, wherein the second adhesive layer is adhered onto an insulating layer formed on the first main surface of the wiring substrate.

12. The semiconductor device according to claim 11, wherein a third capacitor is disposed between a second side of the wiring substrate and the semiconductor chip in plan view, and wherein the third capacitor is exposed from the lid.

13. The semiconductor device according to claim 12, wherein a thickness of the third capacitor is greater than the thickness of the semiconductor chip in the thickness direction of the wiring substrate.

14. The semiconductor device according to claim 13, wherein the lid includes an opening portion in which the third capacitor is exposed.

15. The semiconductor device according to claim 14, wherein the lid includes a second lid side opposite the first lid side, the second lid side extending in the first direction such that the second lid side extends along the first side of the wiring substrate, wherein, in plan view, the second lid side of the lid includes a second notched portion that concaves from the second lid side of the lid toward the center portion of the lid, and wherein a fourth capacitor is disposed, on the first main surface of the wiring substrate, in the second notched portion, and wherein the fourth capacitor is exposed from the lid.

\* \* \* \* \*